US010573744B1

(12) United States Patent
Zuniga et al.

(10) Patent No.: US 10,573,744 B1
(45) Date of Patent: Feb. 25, 2020

(54) SELF-ALIGNED, DUAL-GATE LDMOS TRANSISTORS AND ASSOCIATED METHODS

(71) Applicant: Maxim Integrated Products, Inc., San Jose, CA (US)

(72) Inventors: Marco A. Zuniga, Berkely, CA (US); Adam Brand, Palo Alto, CA (US); Tom K. Castro, Santa Clara, CA (US); Rajwinder Singh, Pleasanton, CA (US); Badredin Fatemizadeh, Palo Alto, CA (US)

(73) Assignee: MAXIM INTEGRATED PRODUCTS, INC., San Jose, CA (US)

( * ) Notice: Subject to any disclaimer, the term of this patent is extended or adjusted under 35 U.S.C. 154(b) by 0 days.

(21) Appl. No.: 16/150,441

(22) Filed: Oct. 3, 2018

Related U.S. Application Data

(60) Provisional application No. 62/567,492, filed on Oct. 3, 2017.

(51) Int. Cl.
*H01L 29/78* (2006.01)
*H01L 21/266* (2006.01)
*H01L 29/66* (2006.01)

(52) U.S. Cl.
CPC ........ *H01L 29/7825* (2013.01); *H01L 21/266* (2013.01); *H01L 29/66704* (2013.01); *H01L 29/7831* (2013.01)

(58) Field of Classification Search
CPC ....................... H01L 29/7825; H01L 29/66704
See application file for complete search history.

(56) References Cited

U.S. PATENT DOCUMENTS 9,640,663 B2 5/2017 Chen et al.

FOREIGN PATENT DOCUMENTS

CN 102148251 A 10/2011
CN 103915506 B 9/2014

OTHER PUBLICATIONS

Fan et al. "Dual-gate lateral double-diffused metal-oxide semiconductor with ultra-low specific on-resistance", Apr. 2013, Chinese Physics B, vol. 22, No. 4, pp. 048501-1 through 048501-6 (Year: 2013).*
Erlbacher et al. (2012) "Significant On-Resistance Reduction of LDMOS Devices by Intermitted Trench Gates Integration," vol. 9, No. 12, 7 pp.

* cited by examiner

*Primary Examiner* — Selim U Ahmed
*Assistant Examiner* — Evan G Clinton
(74) *Attorney, Agent, or Firm* — Lathrop GPM LLP

(57) ABSTRACT

A dual-gate, self-aligned lateral double-diffused metal-oxide-semiconductor (LDMOS) transistor includes a silicon semiconductor structure, a lateral gate including a first dielectric layer and a first conductive layer stacked on the silicon semiconductor structure in a thickness direction, and a vertical gate. The vertical gate includes a second dielectric layer and a second conductive layer disposed in a trench of the silicon semiconductor structure, the second dielectric layer defining an edge of the lateral gate in a lateral direction. A method for forming a dual-gate, self-aligned LDMOS transistor includes (a) forming a vertical gate of the LDMOS transistor in a trench of a silicon semiconductor structure and (b) defining a lateral edge of a lateral gate of the LDMOS transistor using the vertical gate.

20 Claims, 30 Drawing Sheets

SELF-ALIGNED, DUAL-GATE LDMOS TRANSISTORS AND ASSOCIATED METHODS

RELATED APPLICATIONS

This application claims benefit of priority to U.S. Provisional Patent Application Ser. No. 62/567,492, filed Oct. 3, 2017, which is incorporated herein by reference.

BACKGROUND

Metal-oxide-semiconductor field effect transistors, often referred to as MOSFETS, are widely used in electronic devices, such as for switching or amplification. MOSFETS are capable of achieving fast switching speeds, which makes them well suited for use in high-frequency applications. Additionally, MOSFETS are relatively simple to control because they are voltage-controlled, instead of current-controlled, devices.

Lateral double-diffused metal-oxide-semiconductor field effect transistors, often referred to as LDMOS transistors, are a class of MOSFETS where drain-to-source voltage is blocked within the transistors' semiconductor material primarily in a lateral direction. LDMOS transistors are often combined with other circuitry in integrated circuits, especially in power applications or radio-frequency applications.

FIG. 1 is a cross-sectional view of a prior art n-channel LDMOS transistor 100 including a silicon semiconductor structure 102, a source electrode 104, a gate structure 106, and a drain electrode 108. Source electrode 104 is stacked on a top surface 110 of silicon semiconductor structure 102 in a source region 112 of LDMOS transistor 100, and drain electrode 108 is stacked on top surface 110 in a drain region 114 of LDMOS transistor 100. Gate structure 106 includes a gate electrode 116, a polysilicon layer 117, and a silicon dioxide layer 118 stacked in a gate region 120 of LDMOS transistor 100. Silicon semiconductor structure 102 includes a p-type substrate 122, an n-well 124, a p-body 126, a source p+ region 128, a source n+ region 130, and a drain n+ region 132. N-well 124 is formed on p-type substrate 122, and p-body 126 is formed in n-well 124 under source electrode 104. Drain n+ region 132 is formed in n-well 124 and contacts drain electrode 108. Each of source p+ region 128 and source n+ region 130 is formed in p-body 126 and contacts source electrode 104. Each of source n+ region 130 and drain n+ region 132 is more heavily doped than n-well 124, and source p+ region 128 is more heavily doped than p-body 126.

When positive voltage $V_{DS}$ is applied across drain electrode 108 and source electrode 104, a p-n junction at the interface of n-well 124 and p-body 126 is reversed biased. Consequentially, essentially no current flows from drain electrode 108 to source electrode 104 by default. The relative dopant concentration of drain n+ region 132 and n-well 124 causes a portion of n-well 124 referred to as a drift region 134 to carry the majority of voltage $V_{DS}$, thereby enabling LDMOS transistor 100 to support a relatively large value of $V_{DS}$ without breakdown.

A positive voltage $V_{GS}$ applied between gate electrode 116 and source electrode 104 creates negative charges in silicon semiconductor structure 102 under silicon dioxide layer 118, causing a minority-carrier channel to form in a region 136 of p-body 126. This channel has excess electrons and will therefore conduct current. Consequentially, current will flow in the lateral 138 direction through silicon semiconductor structure 102 from drain n+ region 132 to source n+ region 130 when $V_{GS}$ exceeds a threshold value and $V_{DS}$ is a positive value.

DETAILED DESCRIPTION OF THE EMBODIMENTS

Some LDMOS transistors have two gates, such as to help achieve both low on-resistance and high breakdown voltage of the transistor. Each gate in a dual-gate LDMOS transistor is conventionally individually aligned during transistor manufacturing. The gate alignment process is imperfect, and separation distance between the two gates must therefore be relatively large to ensure sufficient separation of the two gates under worst-case gate alignment conditions. Such large gate separation distance disadvantageously results in large pitch in transistor assemblies including multiple LDMOS transistors, which in turn results in large transistor assembly size and long current path lengths. Long current path lengths cause high resistance and associated heating in transistor assemblies.

Figure 1:
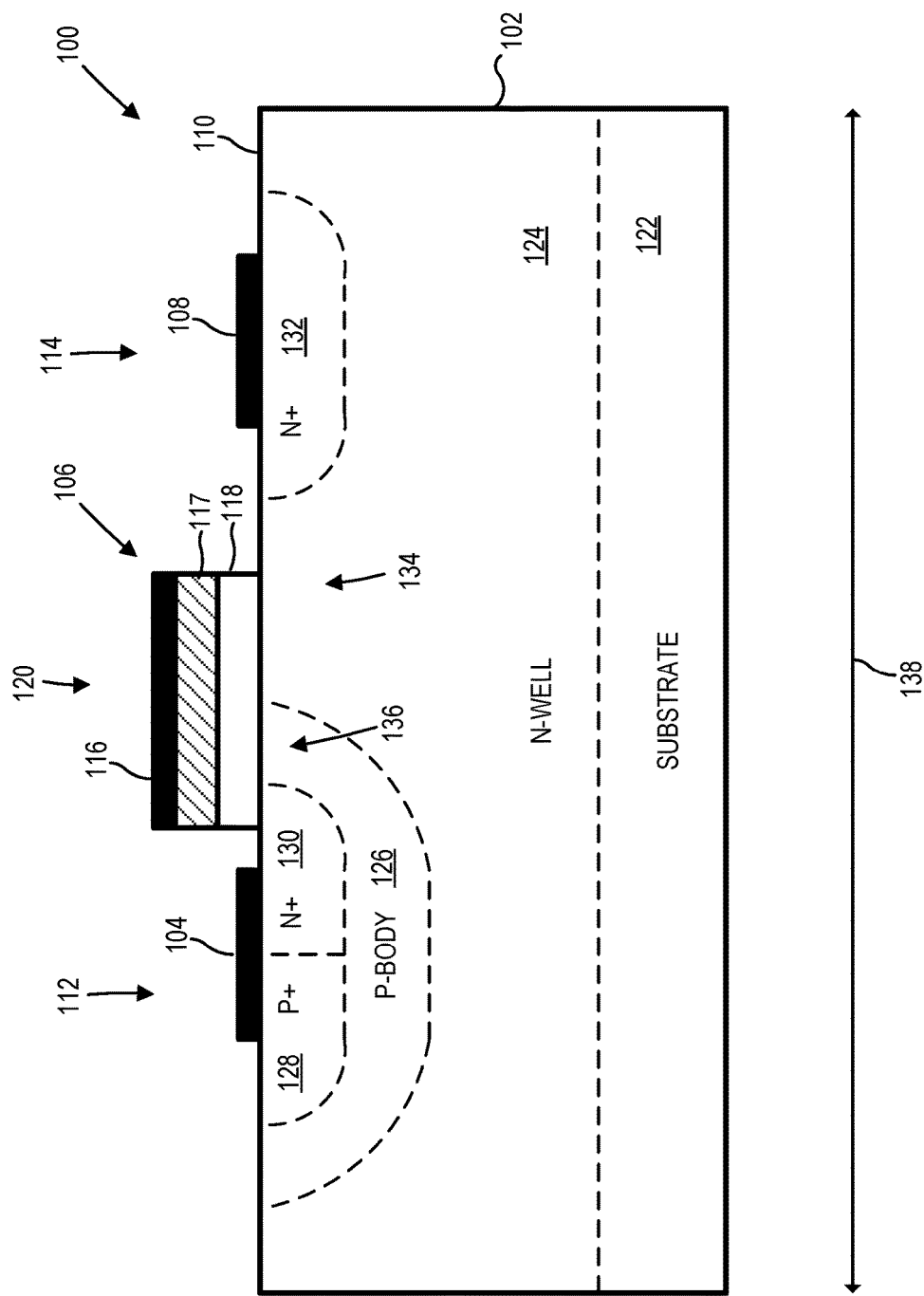
FIG. 1 is a cross-sectional view of a prior-art LDMOS transistor.
Figure 2:
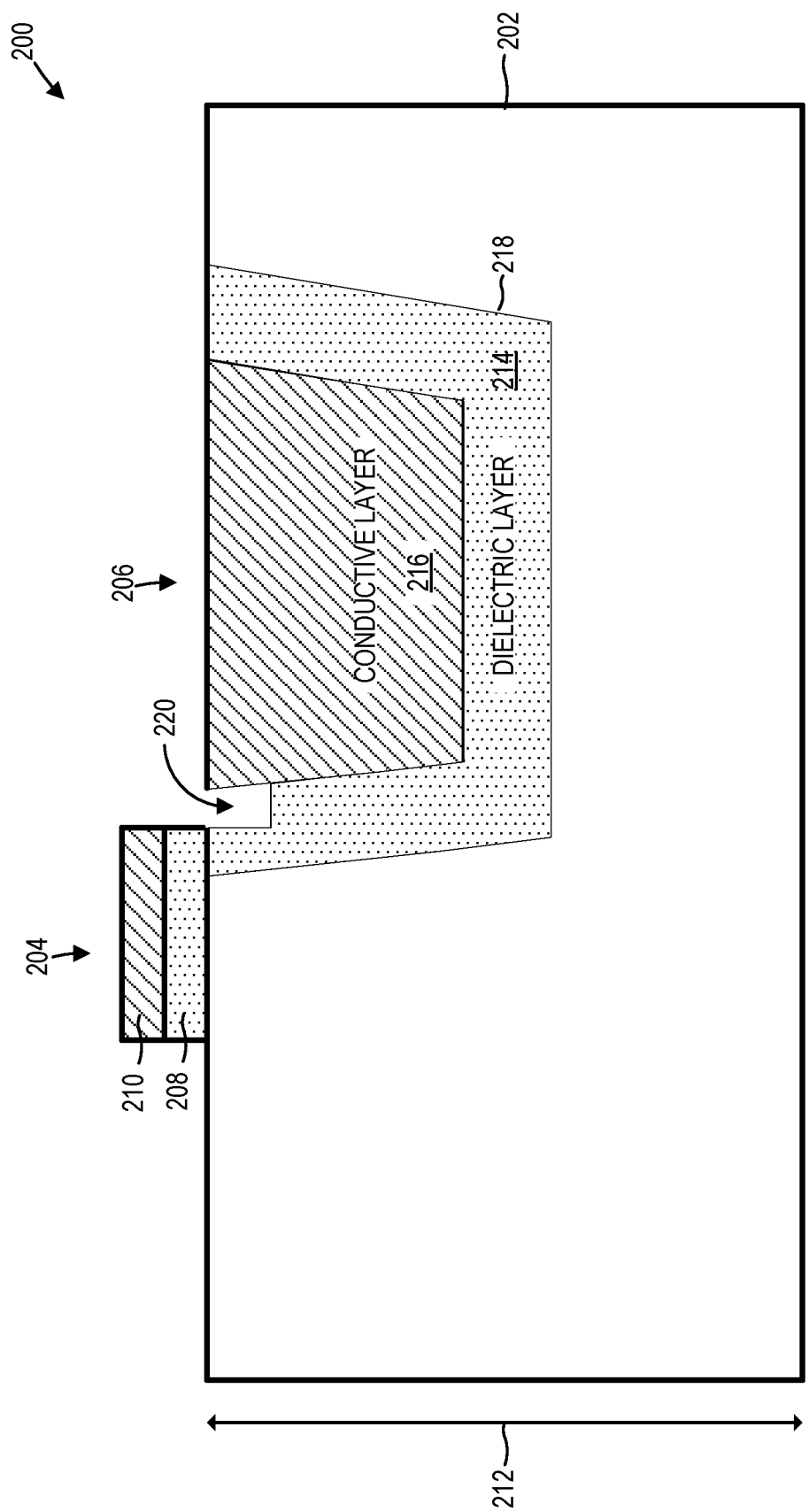
FIG. 2 is a cross-sectional view of a dual-gate n-channel LDMOS transistor where processing of a lateral gate has degraded dielectric isolation between the lateral gate and a vertical gate.

Additionally, individual processing of gates during LDMOS transistor manufacturing may degrade dielectric isolation between the two gates. For example, FIG. 2 is a cross-sectional view of a dual-gate n-channel LDMOS transistor 200 where processing of a lateral gate has degraded dielectric isolation between the lateral gate and a vertical gate. LDMOS transistor 200 includes including a silicon semiconductor structure 202, a lateral gate 204, and a vertical gate 206. Lateral gate 204 includes a first dielectric layer 208 and a first conductive layer 210 stacked on silicon semiconductor structure 202 in a thickness 212 direction, and vertical gate 206 includes a second dielectric layer 214 and a second conductive layer 216 disposed in a trench 218 of silicon semiconductor structure 202. Details of silicon semiconductor structure 202 are not shown in FIG. 2. Vertical gate 206 was formed before lateral gate 204, and processing of lateral gate 204 caused a portion 220 of second dielectric layer 214 to be unintentionally removed, thereby impairing dielectric isolation between lateral gate 204 and vertical gate 206.

Applicant has developed dual-gate LDMOS transistors and associated methods which at least partially overcome one or more of the above-discussed drawbacks associated with conventional dual-gate LDMOS transistors. These new LDMOS transistors are self-aligned in that a vertical gate at least partially defines a lateral edge of a lateral gate, thereby eliminating the need to separately align each gate during transistor manufacturing. Such self-alignment of the lateral gate may enable a gate separation distance between the lateral and vertical gates to be minimized by eliminating effects of gate alignment tolerance on gate separation distance. Consequently, the new dual-gate, self-aligned LDMOS transistors may enable smaller pitch and shorter current paths than conventional dual-gate LDMOS transistors. Additionally, the self-alignment of the lateral gate helps eliminate undesired dielectric layer removal associated with individual gate processing.

Figure 3:
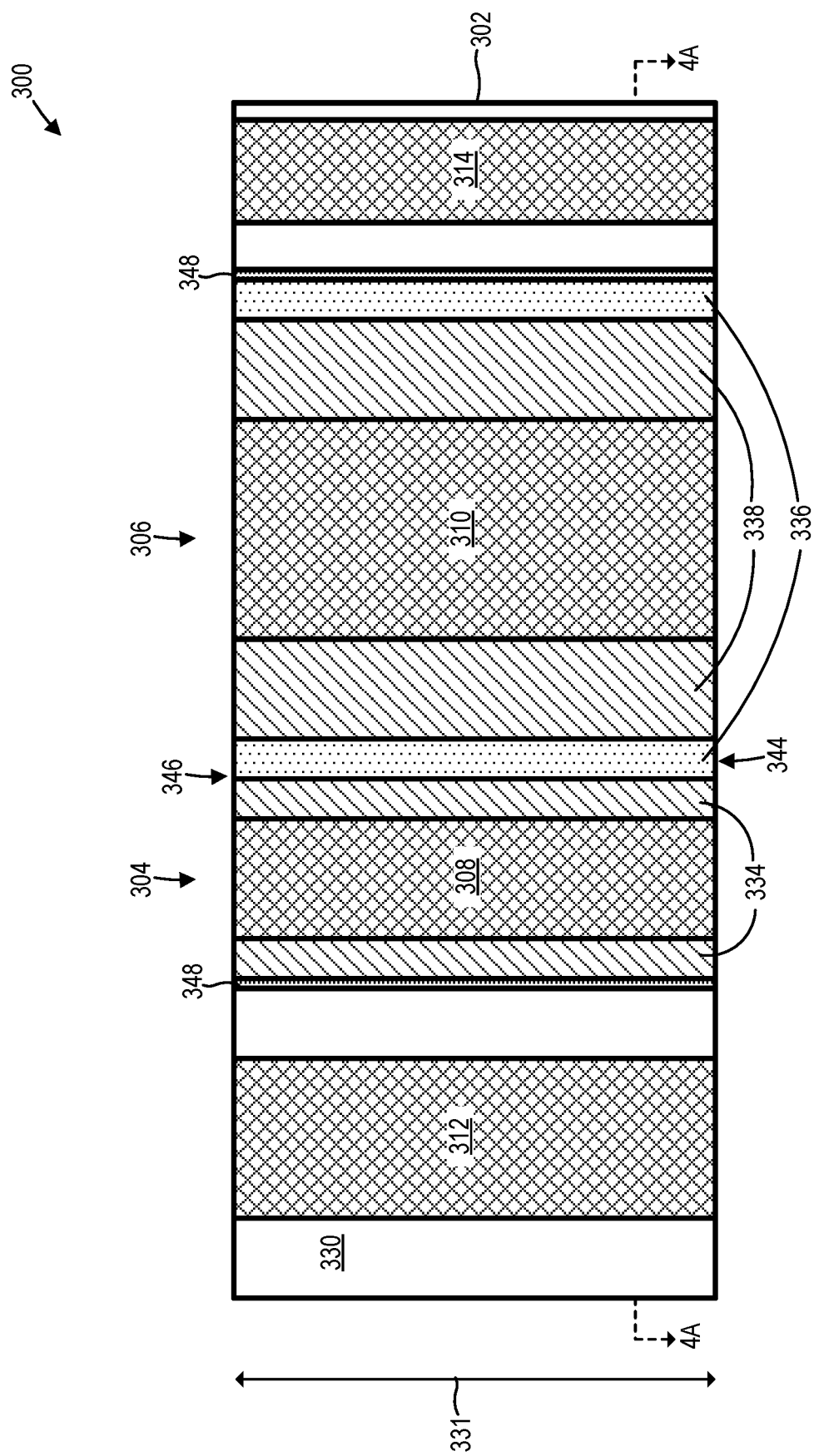
FIG. 3 is a top plan view of a dual-gate, self-aligned LDMOS transistor, according to an embodiment.
Figure 4:
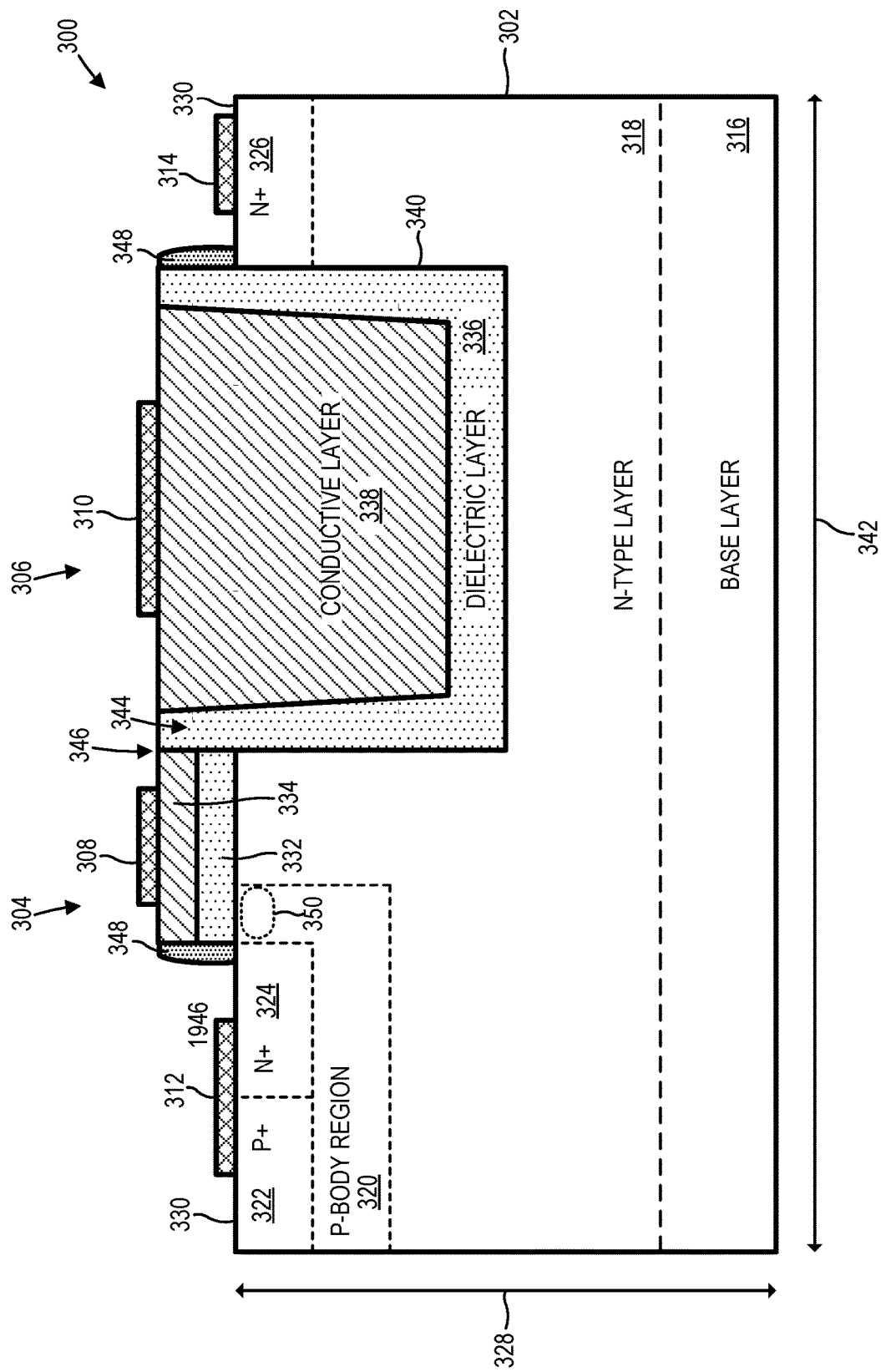
FIG. 4 is a cross-sectional view of the FIG. 3 LDMOS transistor taken along line 4A-4A of FIG. 3

FIG. 3 is a top plan view of a dual-gate, self-aligned LDMOS transistor 300. FIG. 4 is a cross-sectional view of LDMOS transistor 300 taken along line 4A-4A of FIG. 3. FIGS. 3 and 4 are best viewed together in the following discussion. LDMOS transistor 300 includes a silicon semiconductor structure 302, a lateral gate 304, a vertical gate 306, a first gate electrode 308, a second gate electrode 310, a source electrode 312, and a drain electrode 314.

Silicon semiconductor structure 302 includes a base layer 316, an n-type layer 318, a p-body region 320, a source p+ region 322, a source n+ region 324, and a drain n+ region 326. Base layer 316 is, for example, an n-type high-voltage well in a silicon substrate, a p-type silicon substrate, or an n-type epitaxial layer grown over a p-type silicon substrate. N-type layer 318 is disposed over base layer 316 in a thickness direction 328, and p-body region 320 is disposed in n-type layer 318 adjacent to an outer surface 330 of silicon semiconductor structure 302. Source p+ region 322 and source n+ region 324 are each disposed in p-body region 320, and drain n+ region 326 is disposed in n-type layer 318 adjacent to outer surface 330. Source p+ region 322 has a greater p-type dopant concentration than p-body region 320, and each of source n+ region 324 and drain n+ region 326 has a greater n-type dopant concentration than n-type layer 318. Source electrode 312 contacts each of source p+ region 322 and source n+ region 324, and drain electrode 314 contacts drain n+ region 326. The size and/or shape of first gate electrode 308, second gate electrode 310, source electrode 312, and drain electrode 314 may be varied without departing from the scope hereof. In some alternate embodiments, source electrode 312 is replaced with two separate electrodes contacting source p+ region 322 and source n+ region 324, respectively.

Silicon semiconductor structure 302 can include additional impurity regions without departing from the scope hereof. Additionally, the locations of source p+ region 322 and source n+ region 324 within p-body region 320 can be varied. For example, in an alternate embodiment (not illustrated), source p+ region 322 is disposed behind source n+ region 324 in a depth direction 331 within p-body region 320. The depth direction 331 is orthogonal to the thickness direction 328.

One or more regions of silicon semiconductor structure 302 optionally has a graded dopant concentration. For example, in some embodiments, n-type layer 318 has a graded n-type dopant concentration where n-type dopant concentration is greatest near drain n+ region 326, and p-body region 320 has a graded p-type dopant concentration where p-type dopant concentration is greatest near source n+ region 324. In certain embodiments, n-type layer 318 is configured to have n-type dopant gradient concentrations which help maximize accumulation conductance while maintaining desired breakdown voltage of LDMOS transistor 300.

Lateral gate 304 includes a first dielectric layer 332 and a first conductive layer 334 stacked on silicon semiconductor structure 302 in the thickness direction 328, such that first dielectric layer 332 is disposed between silicon semiconductor structure 302 and first conductive layer 334. First gate electrode 308 contacts first conductive layer 334 to provide an electrical interface to lateral gate 304. Vertical gate 306 includes a second dielectric layer 336 and a second conductive layer 338 disposed in a trench 340 in silicon semiconductor structure 302. Trench 340 extends into silicon semiconductor structure 302 in the thickness direction 328, and second conductive layer 338 is embedded in second dielectric layer 336. Lateral gate 304 extends over a portion of p-body region 320 in the thickness 328 direction, and lateral gate 302 is disposed between source n+ region 324 and vertical gate 306 in a lateral direction 342, where the lateral direction 342 is orthogonal to each of the thickness direction 328 and the depth direction 331. Vertical gate 306 is disposed between lateral gate 304 and drain n+ region 326 in the lateral direction 342.

First dielectric layer 332 and second dielectric layer 336 are formed, for example, of silicon dioxide or a high-K dielectric material such as one or more of $HfO_2$, $TiO_2$, $ZrO_2$, and $HfAlO_x$. First conductive layer 334 and second conductive layer 338 are formed, for example, of polysilicon or metal.

A portion of second dielectric layer 336 forms a spacer 344 which defines an edge 346 of lateral gate 304 in the lateral direction 342. Consequently, in contrast with conventional dual-gate LDMOS transistors, lateral gate 304 and vertical gate 306 are not independently aligned during LDMOS transistor processing. Instead, lateral gate 304 alignment is defined by vertical gate 306, such that lateral gate 304 is self-aligned by vertical gate 306. Such self-alignment of lateral gate 304 essentially eliminates possibility of relative misalignment of lateral gate 304 and vertical 306, and therefore, lateral separation distance between lateral gate 304 and vertical gate 306 can be relatively small. Consequently, a transistor assembly including dual-gate, self-aligned LDMOS transistors 300 may be smaller and have shorter current paths than a transistor assembly including conventional dual-gate transistors. Additionally, the configuration of LDMOS transistor 300 helps prevent undesired removal of second dielectric layer 336, as discussed below, thereby promoting robust dielectric isolation between lateral gate 304 and vertical gate 306. Indeed, in certain embodiments, spacer 344 of second dielectric layer 336 adjoins first conductive layer 334 in the lateral direction 342, as illustrated in FIG. 4. LDMOS transistor 300 optionally further includes spacers 348 which are formed, for example, of a nitride material.

When positive voltage $V_{DS}$ is applied across drain electrode 314 and source electrode 312, a p-n junction formed at the interface of n-type layer 318 and p-body region 320 is reversed biased, so that very little current flows between drain electrode 314 and source electrode 312 by default. However, a positive voltage $V_{GS}$ applied between first gate electrode 308 and source electrode 312 creates negative charges in silicon semiconductor structure 302 under first dielectric layer 332, causing a minority-carrier channel to form in a region 350 of p-body region 320. This channel has excess electrons and therefore conducts electric current through p-body region 320 from n-type layer 318 to source n+ region 324. Consequentially, current will flow predominately in the lateral 342 direction through silicon semiconductor structure 302 from drain n+ region 326 to source n+ region 324 when $V_{GS}$ exceeds a threshold value and $V_{DS}$ is a positive value. The threshold value is established, in part, by the dopant concentration in p-body region 320 and by the thickness of first dielectric layer 332. For example, threshold voltage can be reduced by decreasing p-type dopant concentration in p-body region 320 adjacent to lateral gate 304 and/or by decreasing thickness of first dielectric layer 332. Source p+ region 322 forms an ohmic contact between p-body region 320 and source electrode 312 to help prevent a parasitic bipolar junction transistor (not shown) in silicon semiconductor substrate 302 from activating.

Vertical gate 306 can advantageously be used to promote both low on-resistance and high breakdown of LDMOS transistor 300. In particular, a positive bias voltage applied to second gate electrode 310 relative to source electrode 312 causes negative charges to collect in n-type layer 318 around second dielectric layer 336. These negative charges create a majority-carrier channel in n-type layer 318 adjacent to second dielectric layer 336, thereby providing a low-resistance current path through n-type layer 318. Additionally, applying a positive bias voltage to second gate electrode 310 reduces potential difference between drain n+ region 326 and second conductive layer 338, thereby promoting high breakdown voltage of LDMOS transistor 300. A constant bias voltage is optionally applied to second gate electrode 310, i.e., bias voltage on second gate electrode 310 remains constant even as voltage on first gate electrode 308 changes during switching of LDMOS transistor 300, to promote low switching losses in LDMOS transistor 300 and simplicity of circuitry (not shown) biasing second gate electrode 310.

Figure 5:
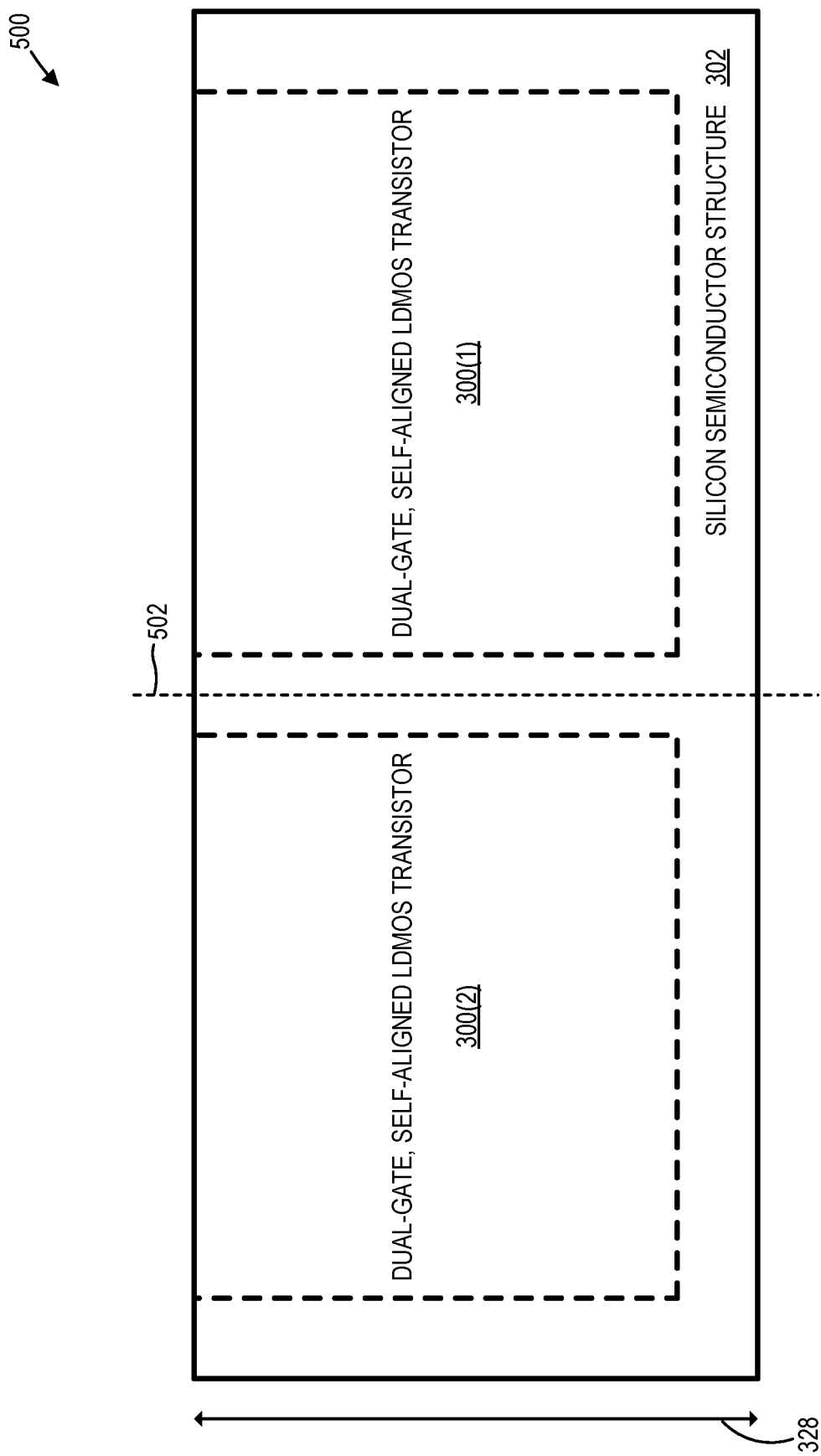
FIG. 5 is a cross-sectional view of a transistor assembly including two instances of the FIG. 3 LDMOS transistor, according to an embodiment.

Additional instances of LDMOS transistor 300 and/or other electronic devices may be formed in silicon semiconductor structure 302 without departing from the scope hereof. For example, FIG. 5 is a cross-sectional view of a transistor assembly 500 including two instances of LDMOS transistor 300, i.e., LDMOS transistor 300(1) and LDMOS transistor 300(2), formed in silicon semiconductor structure 302. LDMOS transistor 300(2) mirrors LDMOS transistor 300(1) with respect to an axis 502 extending in the thickness direction 328. Details of LDMOS transistors 300(1) and 300(2) are not shown in FIG. 5 to promote illustrative clarity.

Figure 6:
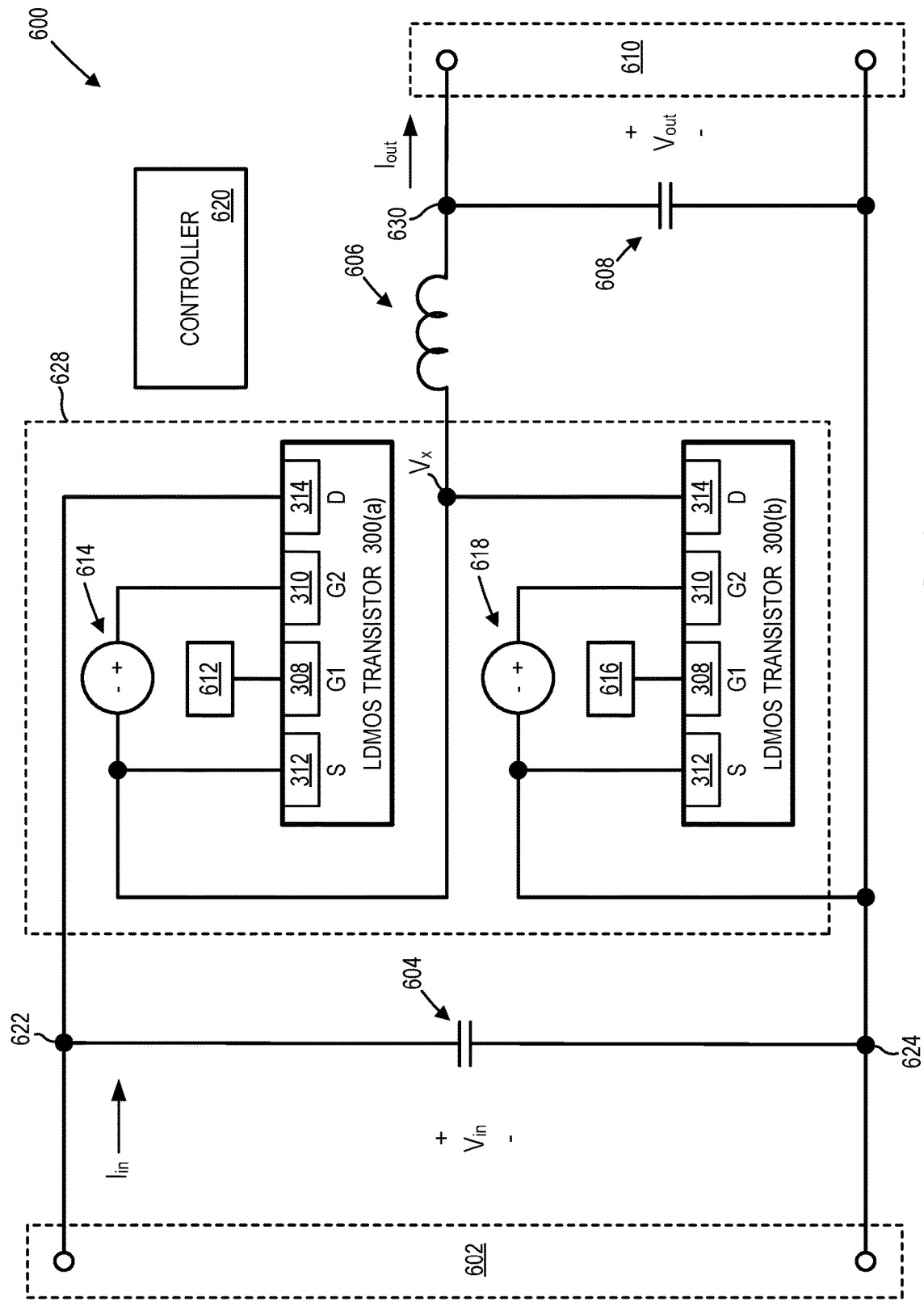
FIG. 6 schematically illustrates a buck converter including two instances of the FIG. 3 LDMOS transistor, according to an embodiment.

One possible application of the LDMOS transistors discussed above is in a switching power converter. For example, FIG. 6 schematically illustrates a buck converter 600 including two instances of LDMOS transistor 300, hereinafter referred to as LDMOS transistor 300(a) and LDMOS transistor 300(b). LDMOS transistors 300(a) and 300(b) are schematically illustrated in FIG. 6 to promote illustrative clarity. Buck converter 600 further includes an input port 602 electrically coupled to an input power source (not shown), an input capacitor 604, an inductor 606, an output capacitor 608, an output port 610 electrically coupled to a load (not shown), first driver circuitry 612, first bias circuitry 614, second driver circuitry 616, second bias circuitry 618, and a controller 620.

Input port 602 is electrically coupled across a positive input node 622 and a reference node 624. Input capacitor 604 is electrically coupled across positive input node 622 and reference node 624, and input capacitor 604 provides a path for input ripple current drawn by buck converter 600. Drain electrode 314 of LDMOS transistor 300(a) is electrically coupled to positive input node 622, and source electrode 312 of LDMOS transistor 300(a) is electrically coupled to a switching node $V_x$. First gate electrode 308 and second gate electrode 310 of LDMOS transistor 300(a) are electrically coupled to first driver circuitry 612 and first bias circuitry 614, respectively. Drain electrode 314 of LDMOS transistor 300(b) is electrically coupled to switching node $V_x$, and source electrode 312 of LDMOS transistor 300(b) is electrically coupled to reference node 624. First gate electrode 308 and second gate electrode 310 of LDMOS transistor 300(b) are electrically coupled to second driver circuitry 616 and second bias circuitry 618, respectively. LDMOS transistors 300(a) and 300(b), first driver circuitry 612, first bias circuitry 614, second driver circuitry 616, and second bias circuitry 618 collectively form a switching circuit 628. Inductor 606 is electrically coupled between switching node $V_x$ and a positive output node 630, and output port 610 is electrically coupled across positive output node 630 and reference node 624. Output capacitor 608 is electrically coupled across positive output node 630 and reference node 624, and output capacitor 608 provides a path for output ripple current generated by buck converter 600.

Controller 620 controls switching of switching circuit 628 to transfer power from the power source (electrically coupled to input port 602) to the load (electrically coupled to output port 610). In particular, controller 620 controls first driver circuitry 612 to repeatedly switch first gate electrode 308 of LDMOS transistor 300(a) between two different voltage magnitudes, to repeatedly create and destroy a minority-carrier channel in p-body region 320 of LDMOS transistor 300(a). Consequentially, LDMOS transistor 300(a) repeatedly switches between its conductive and non-conductive states under the control of controller 620. Controller 620 also controls second driver circuitry 616 to repeatedly switch first gate electrode 308 of LDMOS transistor 300(b) between two different voltage magnitudes to cause LDMOS transistor 300(b) to repeatedly switch between its conductive and non-conductive states. Controller 620 controls switching of LDMOS transistor 300(b) such that it performs a freewheeling function, or in other words, such that LDMOS transistor 300(b) provides a path for current flowing through inductor 606 when LDMOS transistor 300(a) is in its non-conductive state. In some embodiments, controller 620 controls switching of switching circuit 628 to regulate one or more parameters of buck converter 600, such as input voltage $V_{in}$, input current $I_{in}$, input power $P_{in}$, output voltage $V_{out}$, output current $I_{out}$, and output power $P_{out}$. Connections between controller 620 and other components of buck converter 600 are not shown to promote illustrative clarity.

First bias circuitry 614 maintains a constant voltage on second gate electrode 310 of LDMOS transistor 300(a) to establish a majority-carrier channel in n-type layer 318 of the transistor, thereby promoting low on-resistance and high breakdown voltage of the transistor. Similarly, second bias circuitry 618 maintains a constant voltage on second gate electrode 310 of LDMOS transistor 300(b) to establish a majority-carrier channel in n-type layer 318 of the transistor, thereby promoting low on-resistance and high breakdown voltage of the transistor.

It should be appreciated that the LDMOS transistors discussed above are not limited to use in a buck converter, or even to use in a switching power converter. For example, LDMOS transistor 300 could alternately be used in an amplifier.

Discussed below are several possible methods of manufacturing the dual-gate, self-aligned LDMOS transistors discussed above. It should be appreciated, however, that the above-discussed dual-gate, self-aligned LDMOS transistors could be manufactured by methods other than those discussed below. Additionally, the manufacturing methods discussed below could be used to manufacture LDMOS transistors other than the above-discussed LDMOS transistors.

Figure 7:
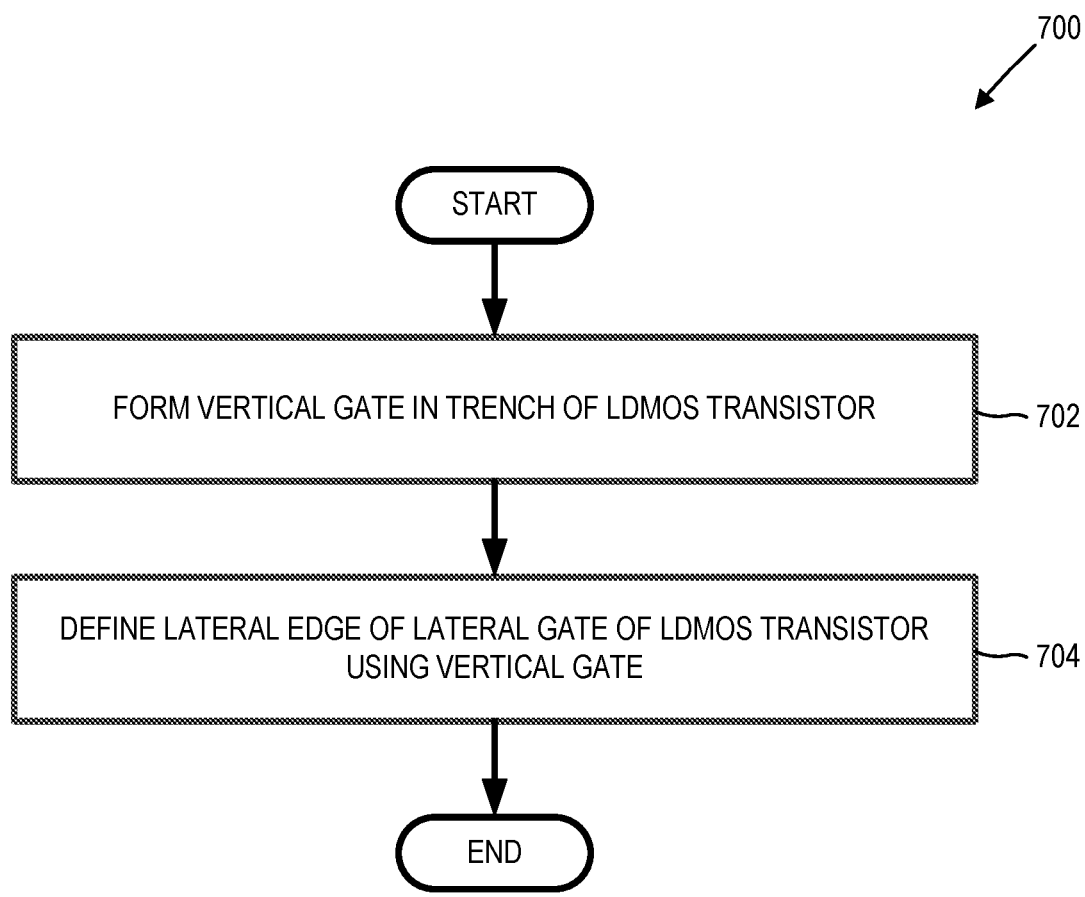
FIG. 7 illustrates a method for forming a dual-gate, self-aligned LDMOS transistor, according to an embodiment.

FIG. 7 illustrates a method 700 for forming a dual-gate, self-aligned LDMOS transistor. In step 702, a vertical gate of the LDMOS transistor is formed in a trench of a silicon semiconductor structure. In one example of step 702, vertical gate 306 is formed in trench 340 of silicon semiconductor structure 302 (FIG. 3). In step 704, a lateral edge of a lateral gate of the LDMOS transistor is defined using the vertical gate. In one example of step 704, lateral edge 346 of lateral gate 304 is defined using spacer 344 portion of second dielectric layer 336.

Figure 8:
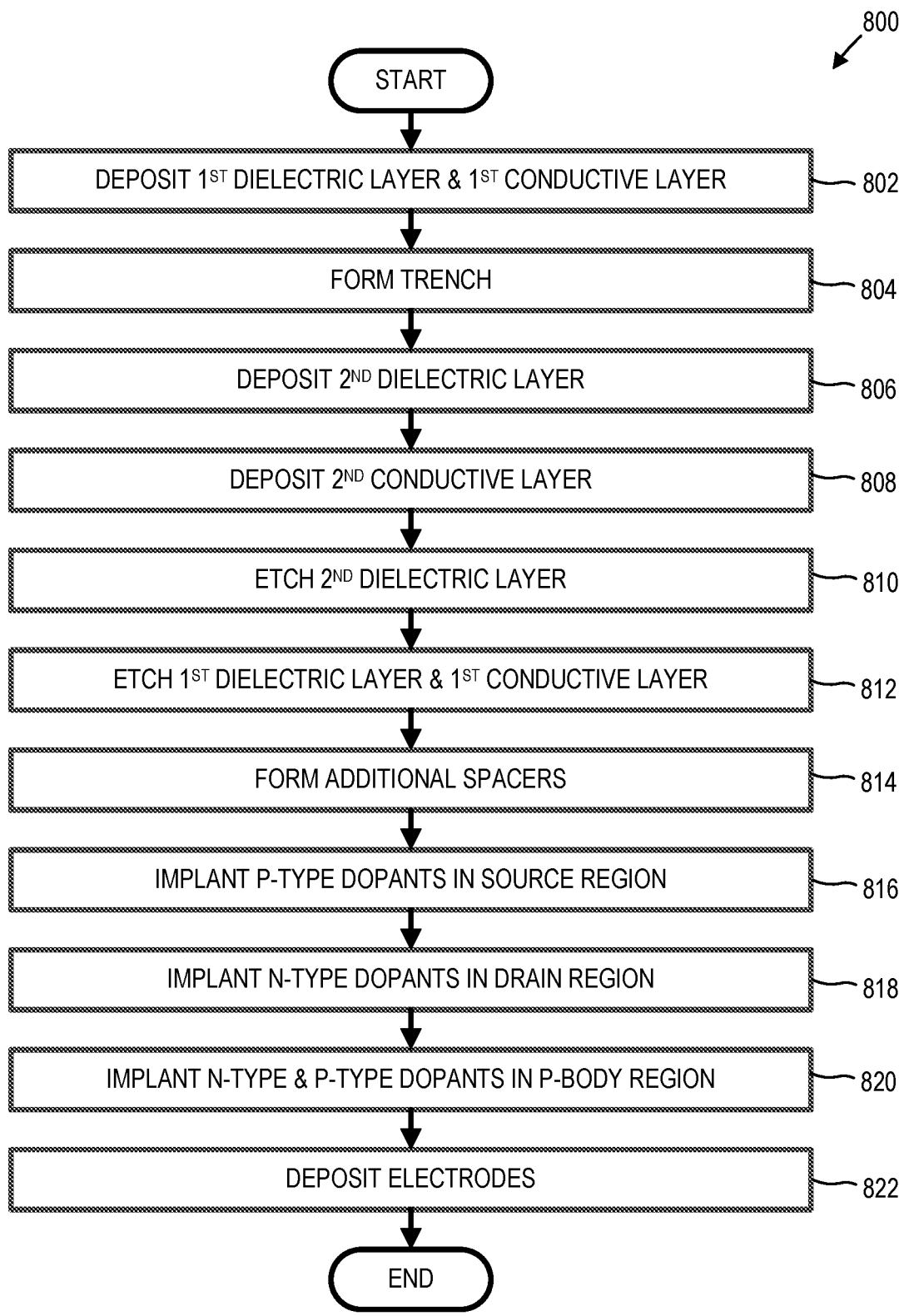
FIG. 8 illustrates one possible implementation of the FIG. 7 method.

FIG. 8 illustrates a method 800 for forming a dual-gate, self-aligned LDMOS transistor. Method 800 is one possible implementation of method 700 of FIG. 7. It should be appreciated, however, that method 700 is not limited to the FIG. 8 implementation but could instead be implemented in other manners without departing from the scope hereof. FIGS. 9-30 illustrate one example of a dual-gate, self-aligned LDMOS transistor analogous to LDMOS transistor 300 being formed according to method 800. Method 800, however, is not limited to forming the LDMOS transistor of FIGS. 9-30.

Figure 9:
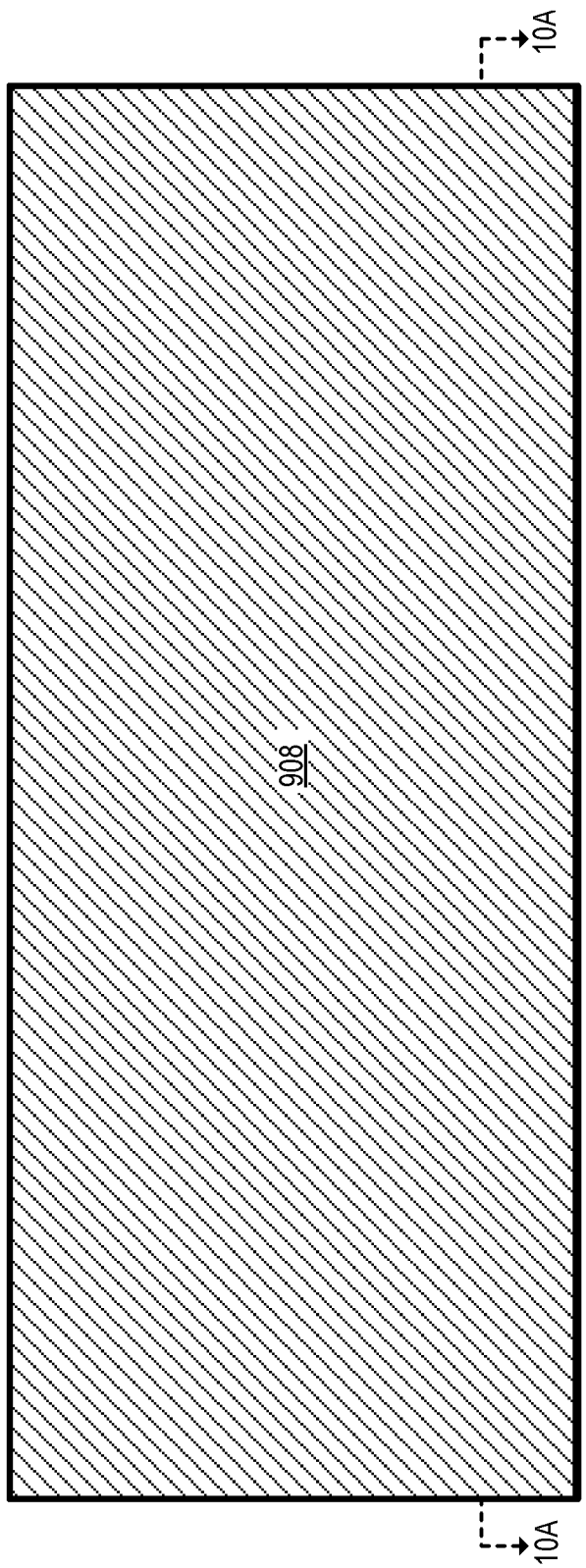
FIGS. 9-30 illustrate one example of a dual-gate, self-aligned LDMOS transistor being formed according to the FIG. 8 method.
Figure 10:
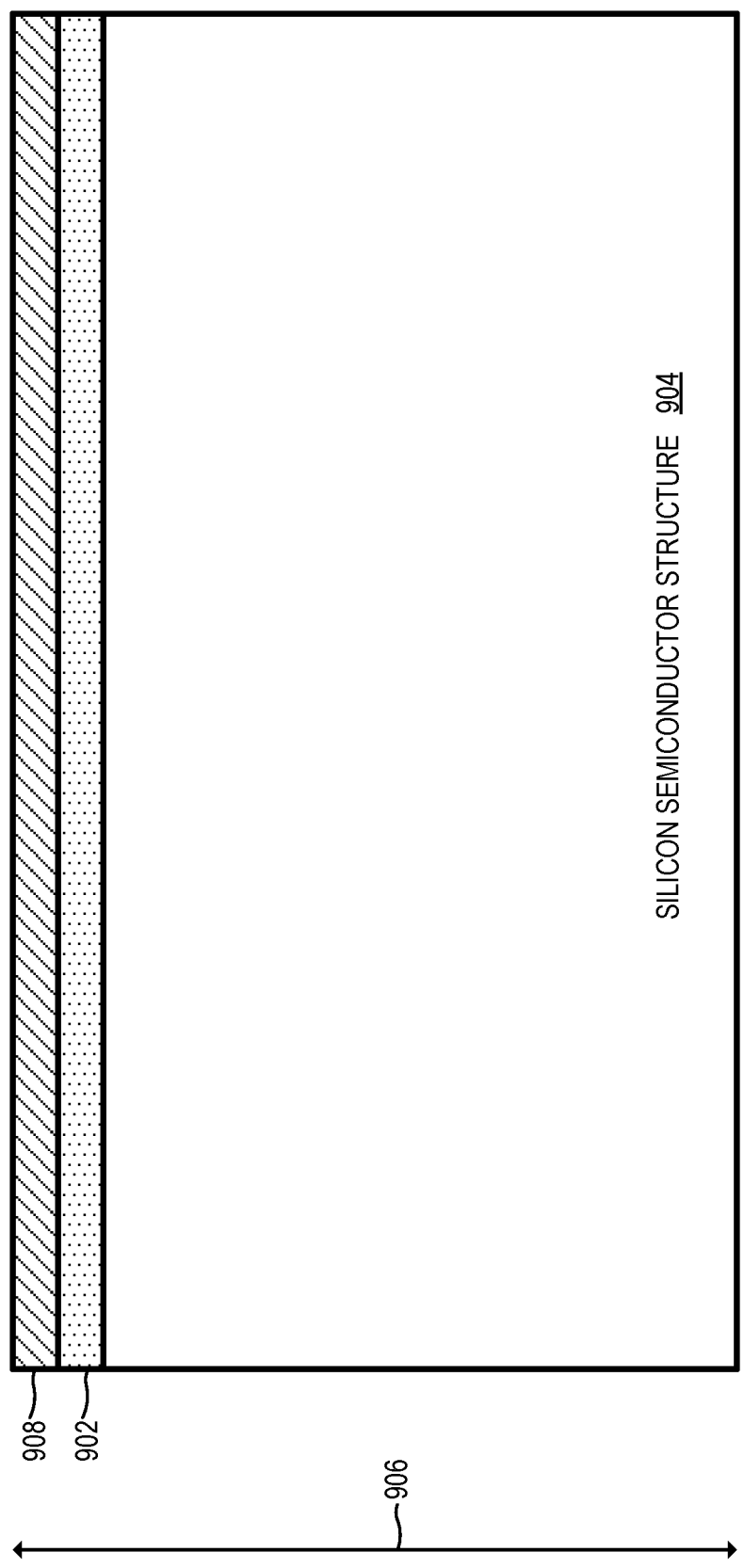
Figure 11:
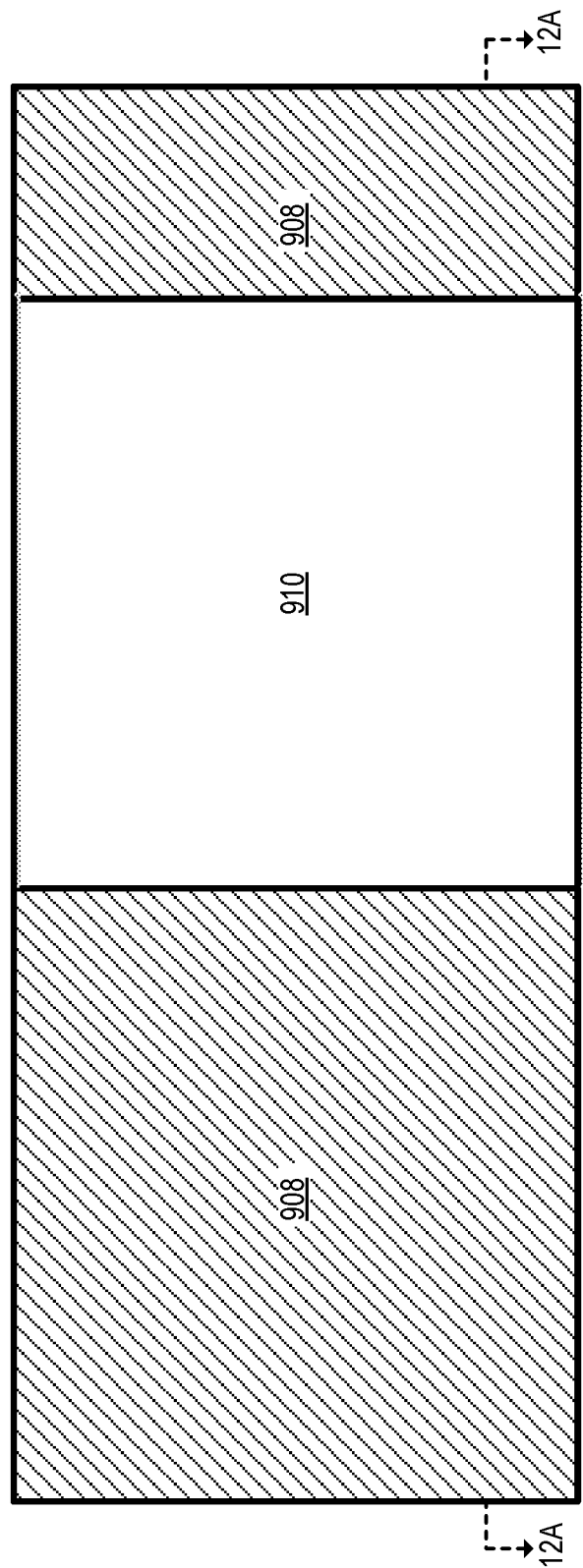
Figure 12:
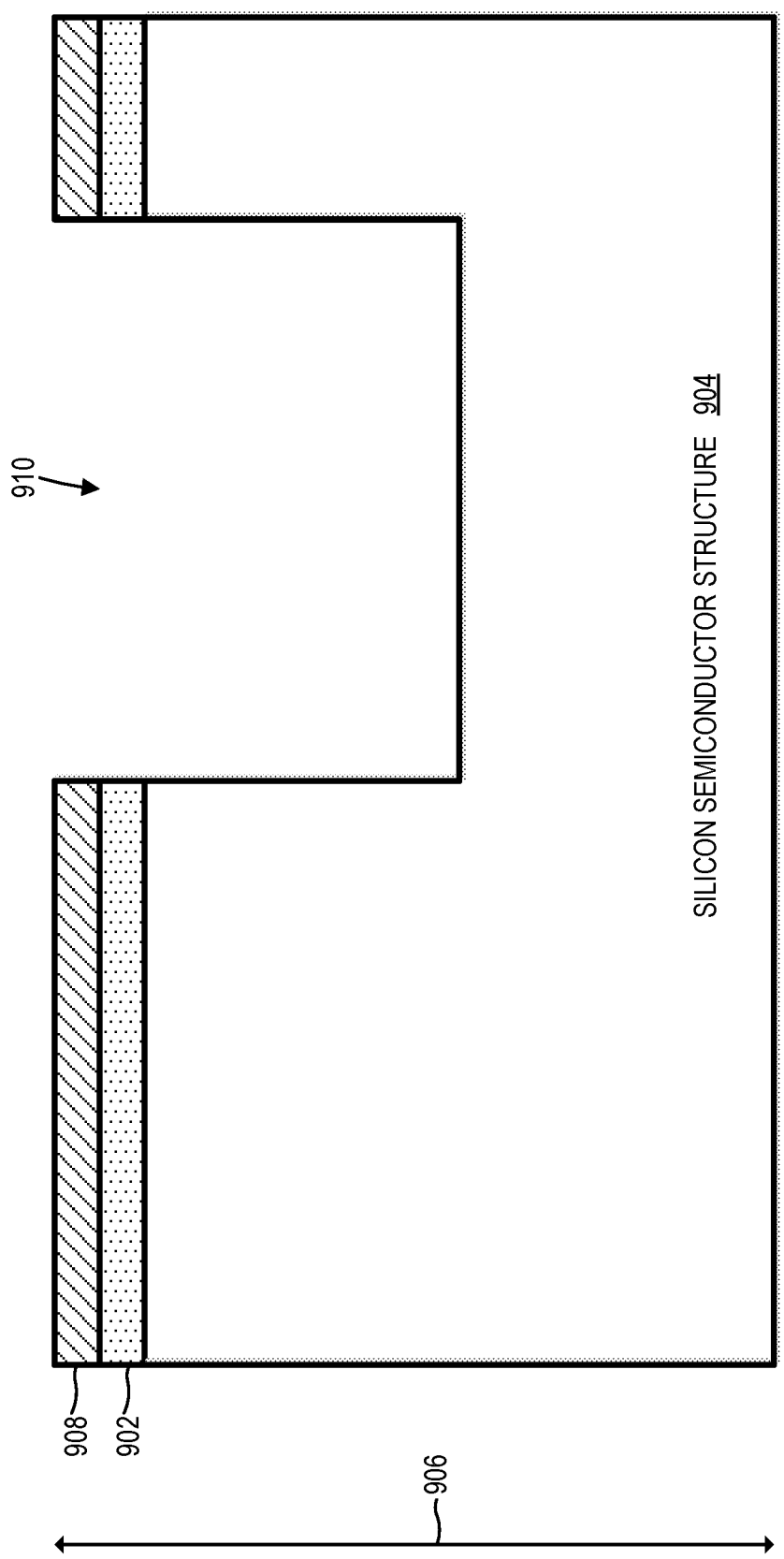

In step 802, a first dielectric layer is deposited on a silicon semiconductor structure in a thickness direction, and a first conductive layer is deposited on the first dielectric layer in the thickness direction. In one example of step 802, a first dielectric layer 902 is deposited on a silicon semiconductor structure 904 in a thickness direction 906, and a first conductive layer 908 is deposited on first dielectric layer 902 in the thickness direction 906, as illustrated in FIGS. 9 and 10. FIG. 9 is a top plan view of silicon semiconductor structure 904, and FIG. 10 is a cross-sectional view taken along lines 10A-10A of FIG. 9. In step 804, a trench is formed in the silicon semiconductor substrate. In one example of step 804 illustrated in FIGS. 11 and 12, a trench 910 is formed in silicon semiconductor structure 904. Trench 910 is formed, for example, by depositing a masking oxide layer (not shown) over silicon semiconductor structure 904, patterning the masking oxide layer to form a window for trench 910, etching silicon semiconductor structure 904 through the window to form trench 910, and removing the masking oxide layer. FIG. 11 is a top plan view of the silicon semiconductor structure, and FIG. 12 is a cross-sectional view taken along lines 12A-12A of FIG. 11.

Figure 13:
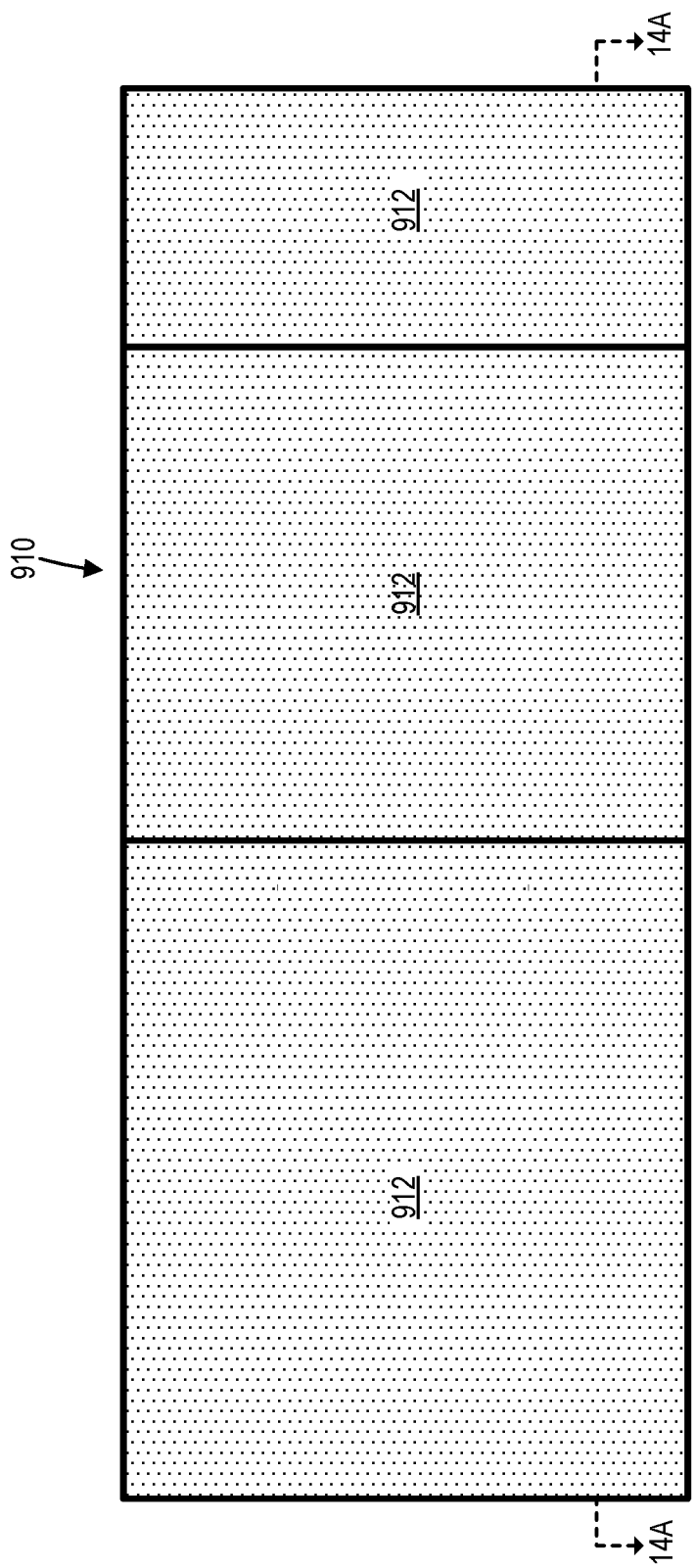
Figure 14:
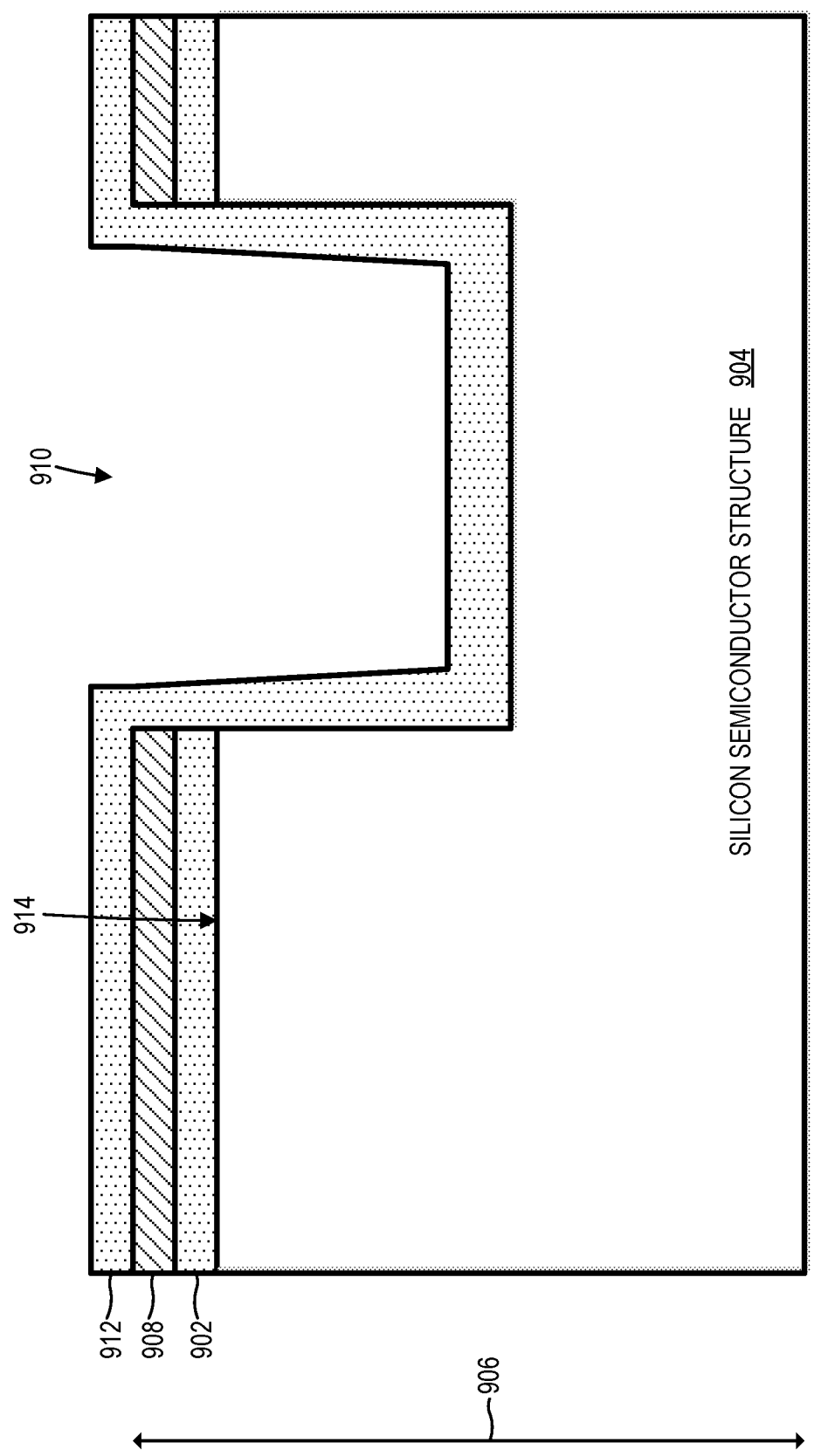
Figure 15:
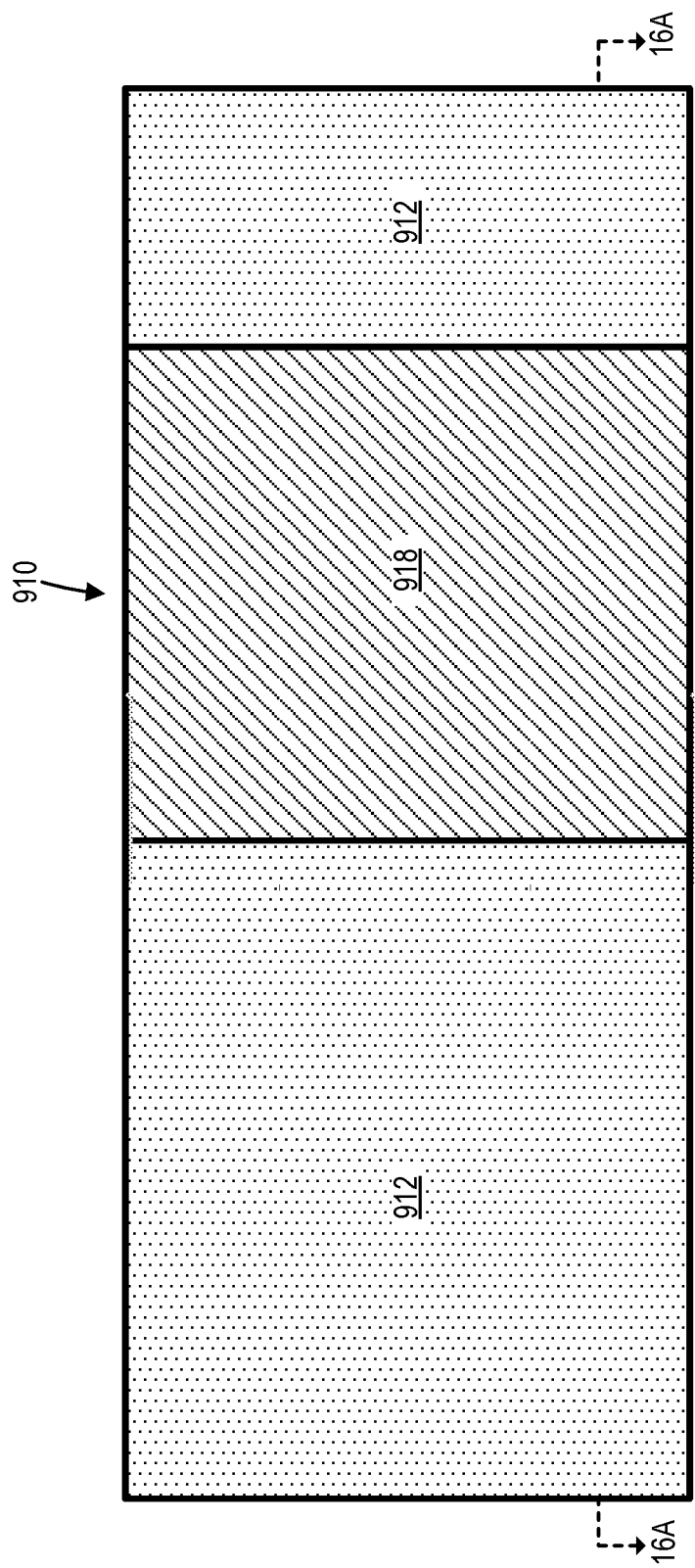
Figure 16:
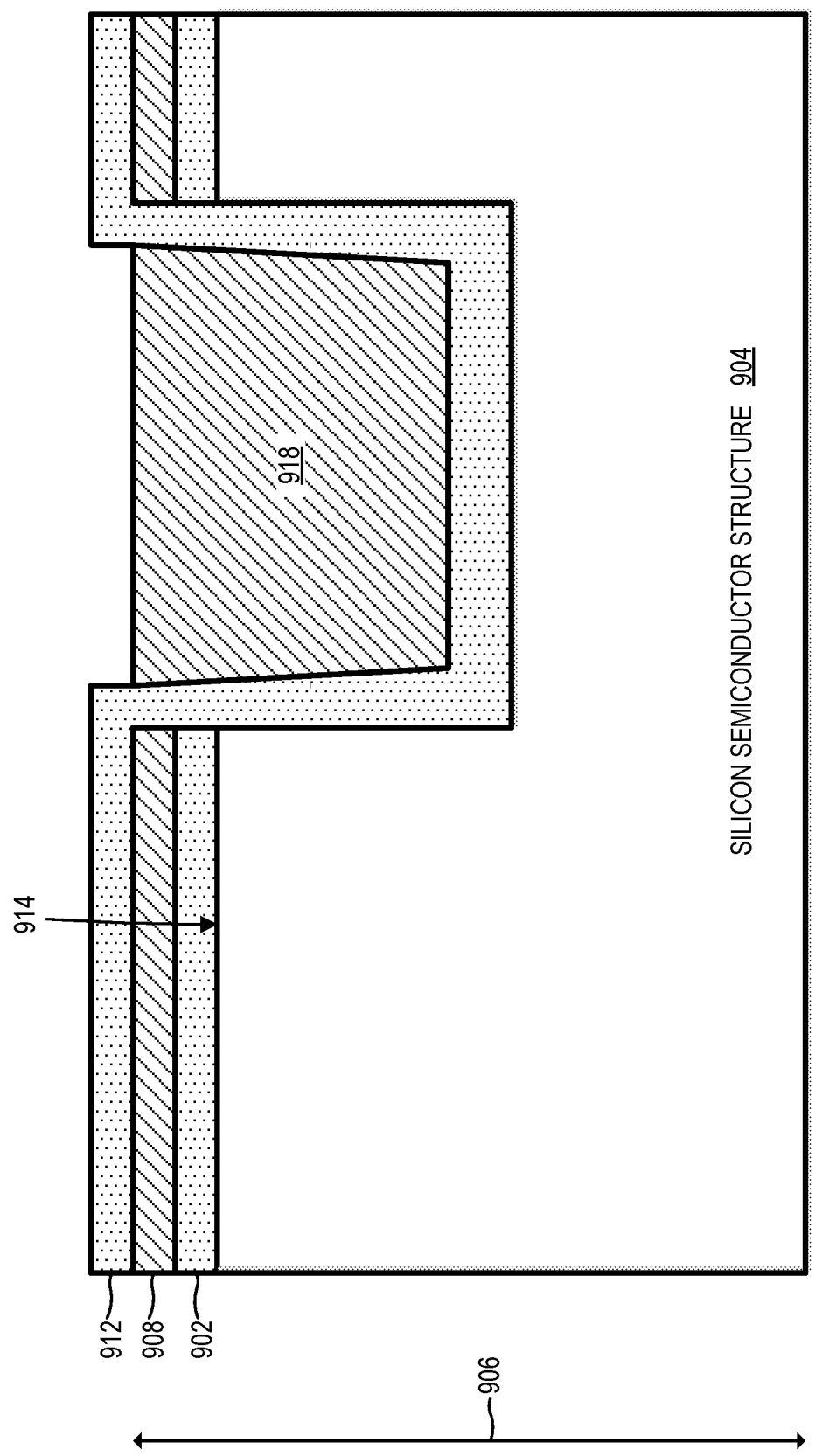

A second dielectric layer is deposited in the trench and over a top surface of the silicon semiconductor structure in step 806. In one example of step 806, a second dielectric layer 912 is deposited in trench 910 and over a top surface 914 of silicon semiconductor structure 904, as illustrated in FIGS. 13 and 14. FIG. 13 is a top plan view of the silicon semiconductor structure, and FIG. 14 is a cross-sectional view taken along lines 14A-14A of FIG. 13. In step 808, a second conductive layer is deposited in the trench, such that the second conductive layer is embedded in the second dielectric layer. In one example of step 808 illustrated in FIGS. 15 and 16, a second conductive layer 918 is deposited in trench 910, such as by depositing conductive material in trench 910 and over top surface 914 and subsequently removing excess conductive material using a chemical-mechanical polishing process. FIG. 15 is a top plan view of the silicon semiconductor structure, and FIG. 16 is a cross-sectional view taken along lines 16A-16A of FIG. 15.

Figure 17:
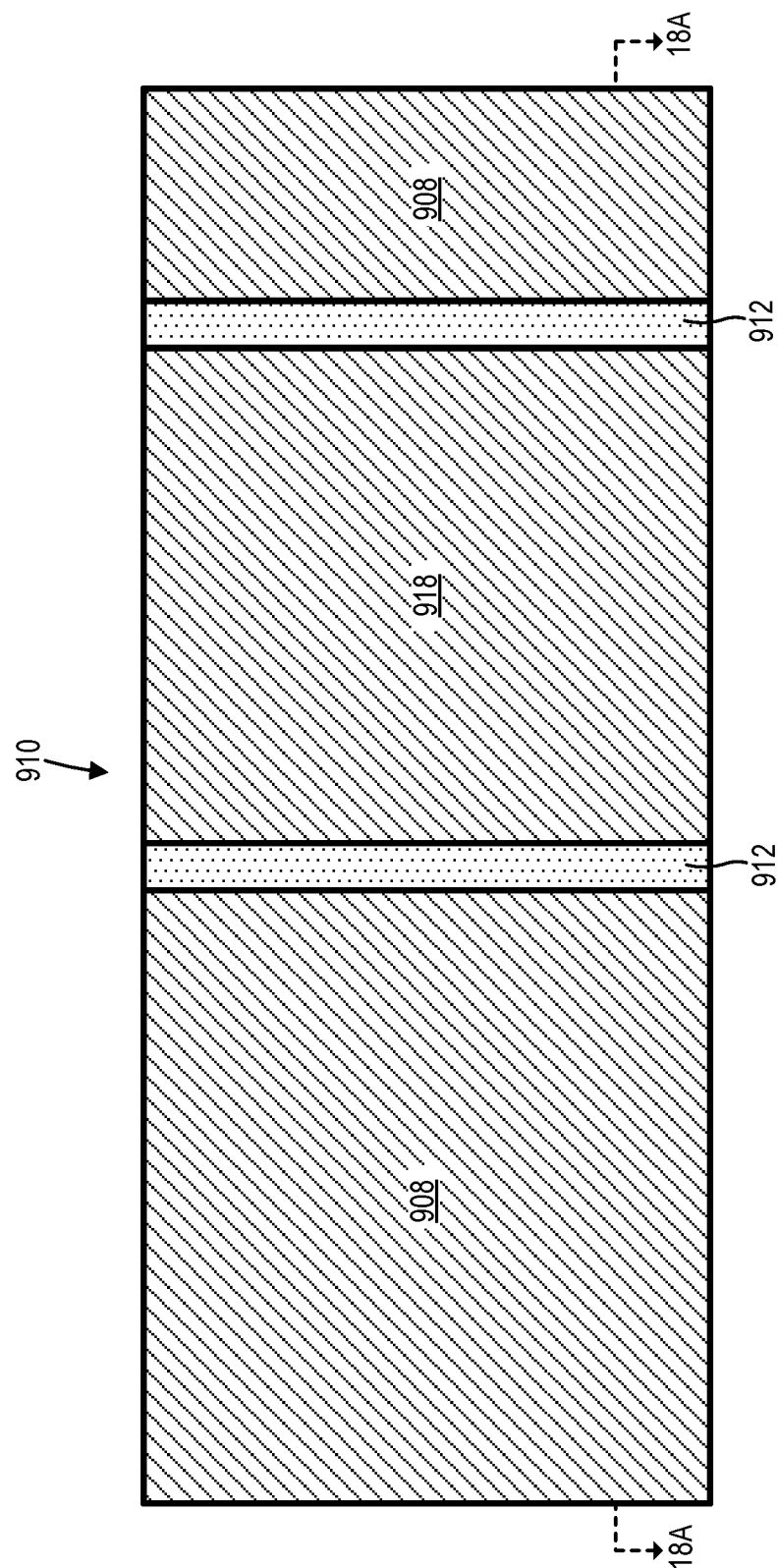
Figure 18:
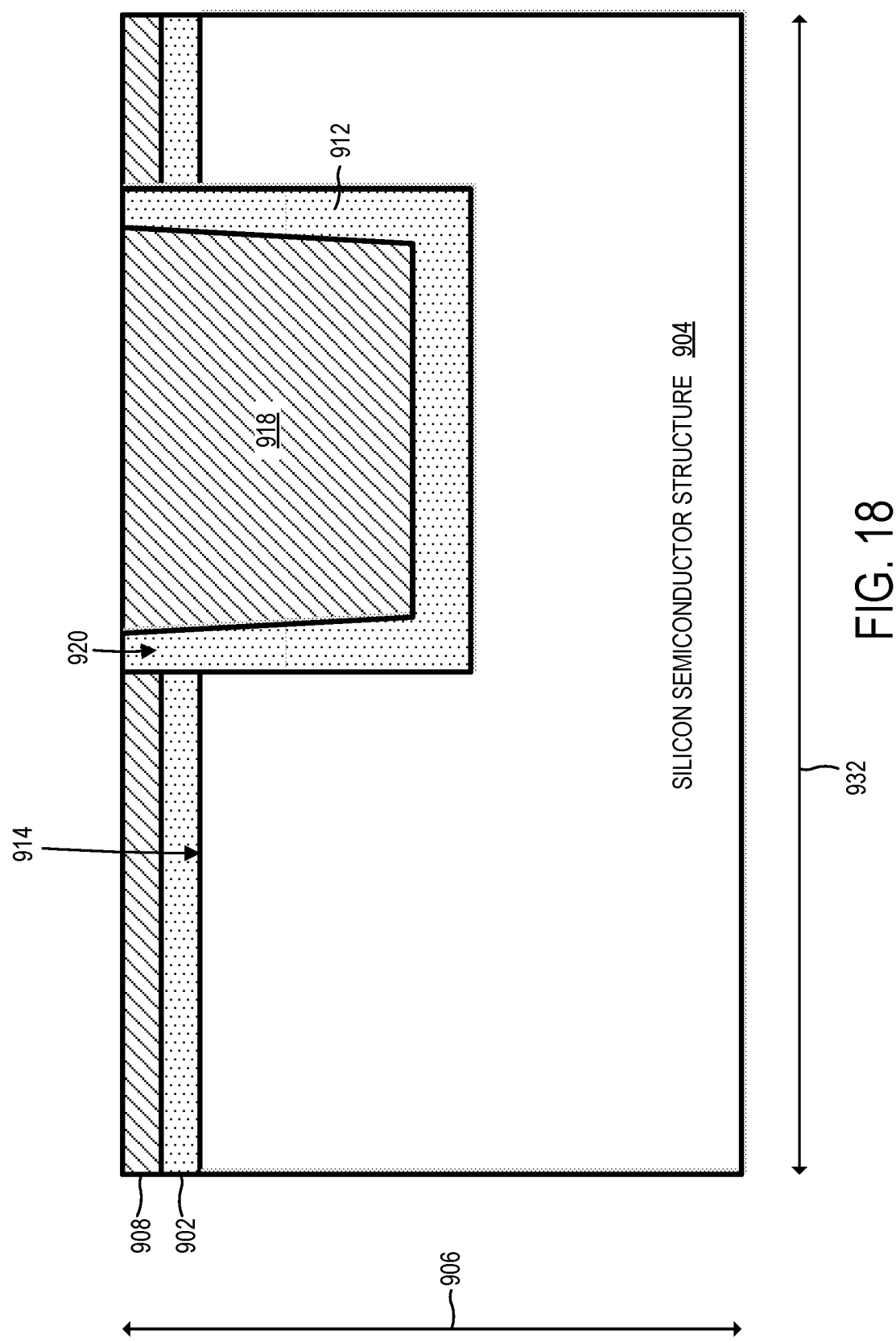

The second dielectric layer is etched in step 810 to form, in part, a spacer separating the first conductive layer from the second conductive layer. In one example of step 810 illustrated in FIGS. 17 and 18, second dielectric layer 912 is selectively etched such that a portion of second dielectric layer 912 forms a spacer 920 separating first conductive layer 908 from second conductive layer 918. FIG. 17 is a top plan view of the silicon semiconductor structure, and FIG. 18 is a cross-sectional view taken along lines 18A-18A of FIG. 17. In certain embodiments, there is no further etching of second dielectric layer 912, thereby helping prevent unintended etching of the dielectric layer, such as the unintended dielectric layer etching discussed above with respect to FIG. 2.

Figure 19:
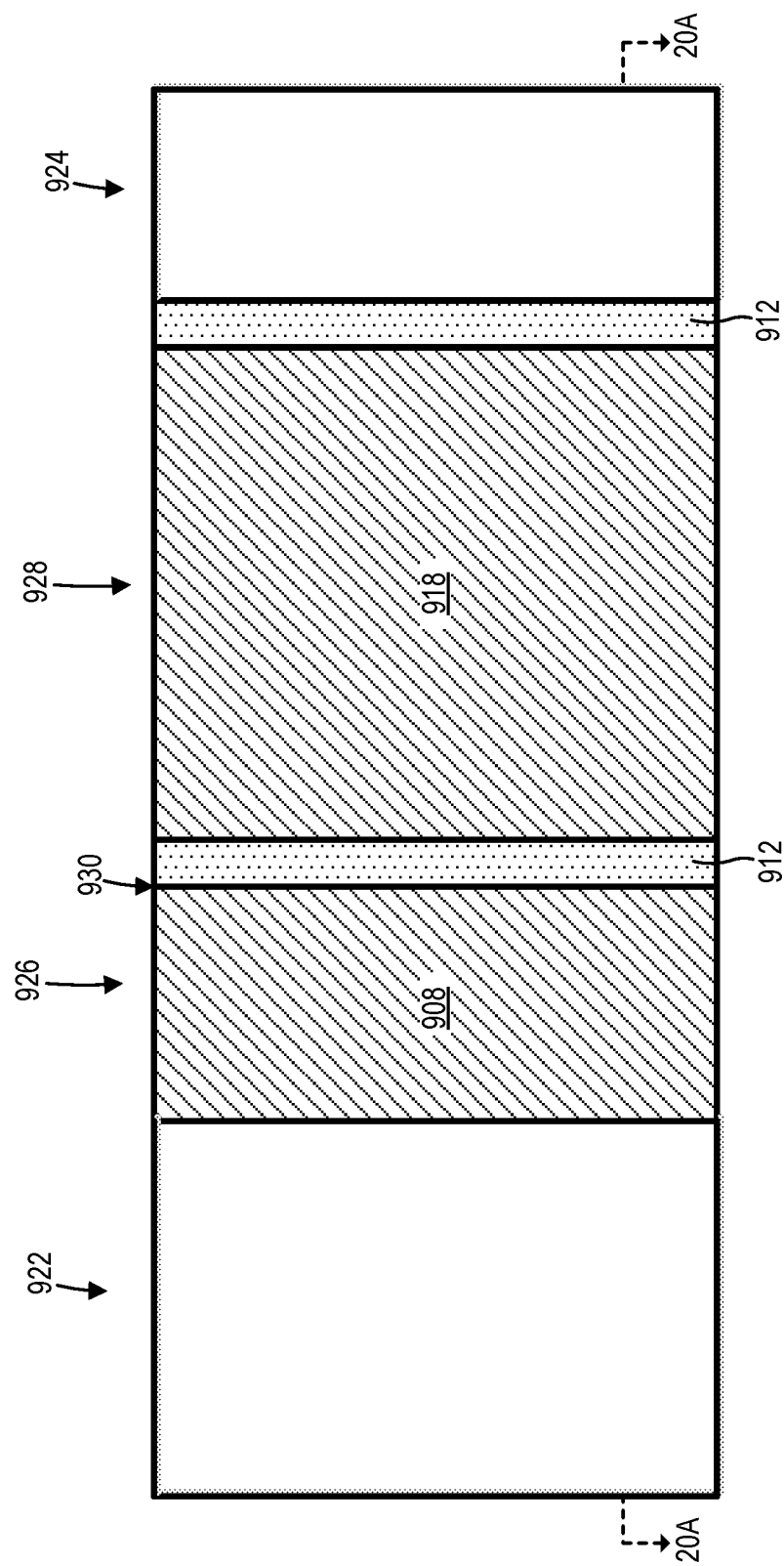
Figure 20:
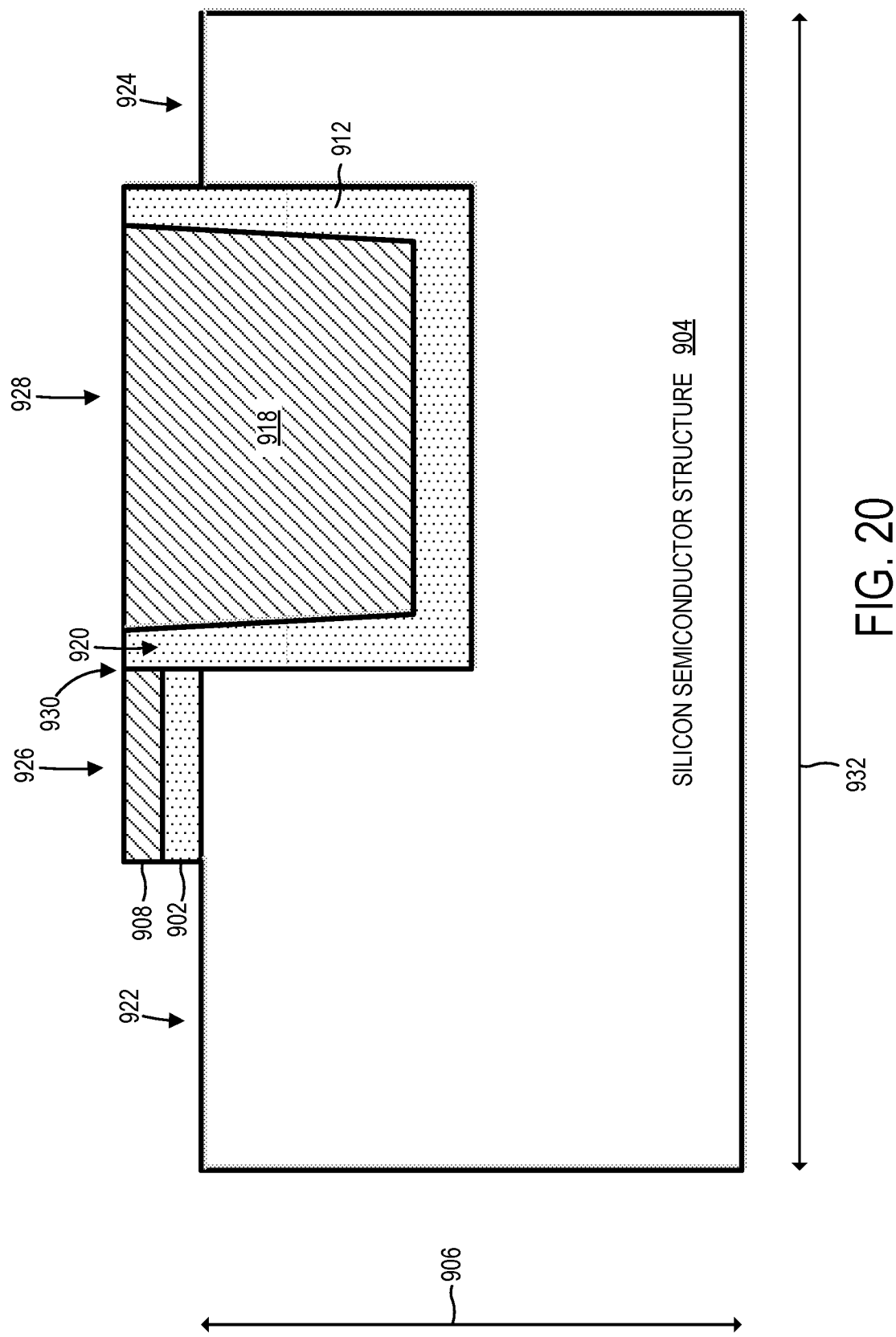

In step 812, the first dielectric layer and the first conductive layer are etched to define a source region of the LDMOS transistor and a drain region of the LDMOS transistor. In one example of step 812, first dielectric layer 902 and first conductive layer 908 are selectively etched to form a source region 922 of the LDMOS transistor and a drain region 924 of the LDMOS transistor, as illustrated in FIGS. 19 and 20. FIG. 19 is a top plan view of the silicon semiconductor structure, and FIG. 20 is a cross-sectional view taken along lines 20A-20A of FIG. 19. First dielectric layer 902 and first conductive layer 908 collectively form a lateral gate 926, and second dielectric layer 912 and second conductive layer 918 collectively form a vertical gate 928. Second dielectric layer 912 defines an edge 930 of lateral gate 926 in a lateral direction 932, where the lateral direction 932 is orthogonal to the thickness direction 906, such that lateral gate 926 is self-aligned with vertical gate 928. Lateral gate 926 is analogous to lateral gate 304 of LDMOS transistor 300, and vertical gate 928 is analogous to vertical gate 306 of LDMOS transistor 300.

Figure 21:
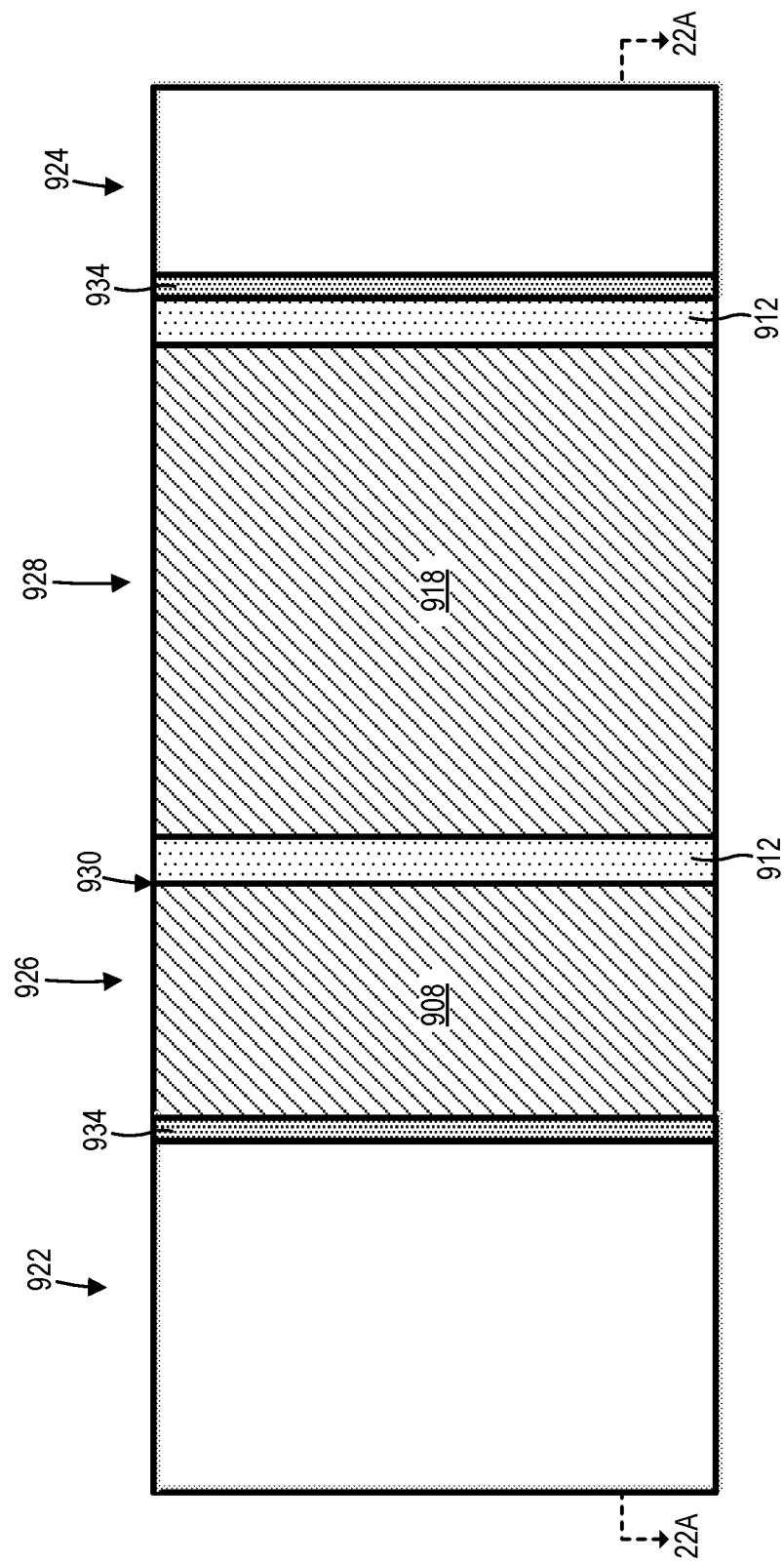
Figure 22:
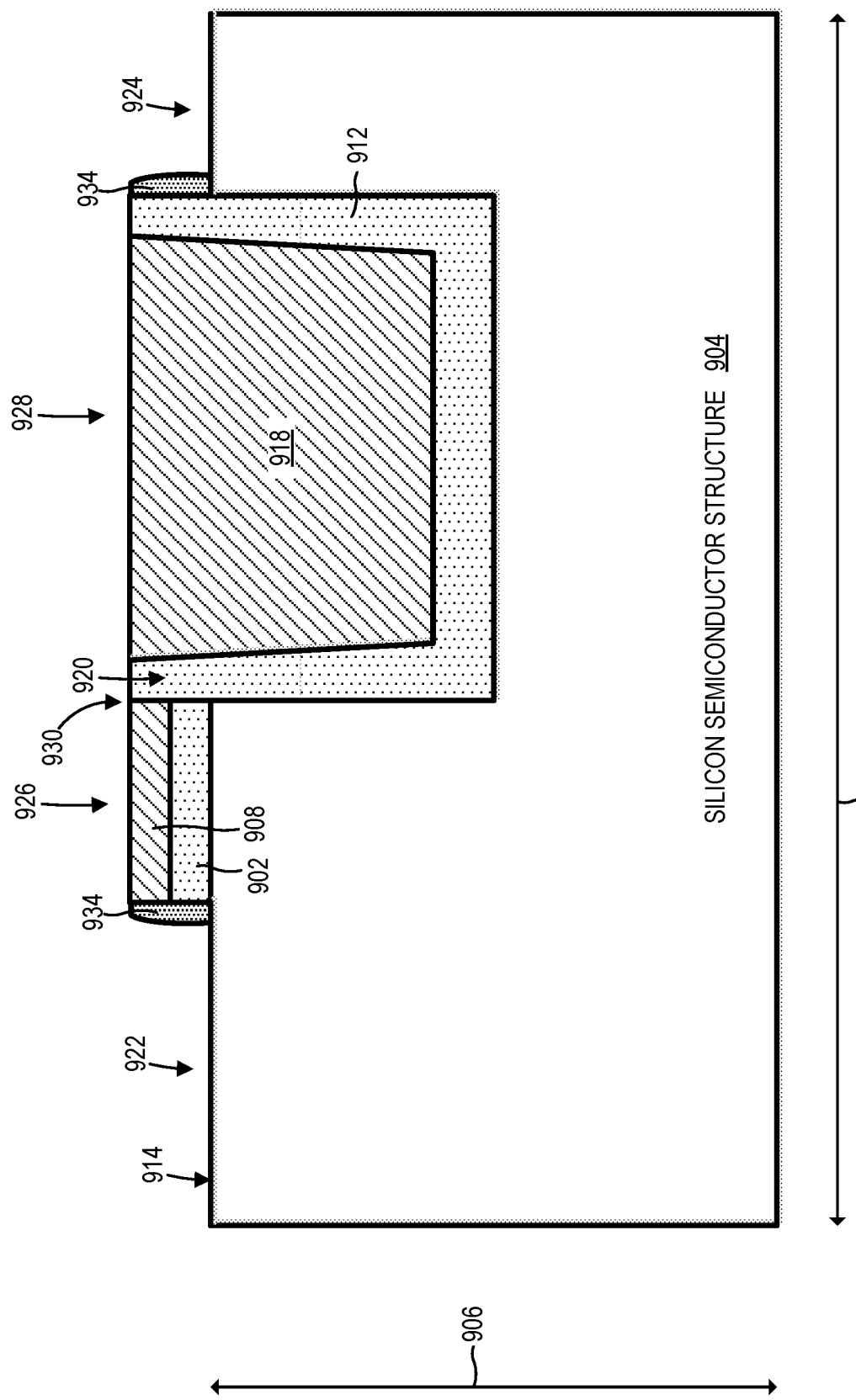

In step 814, additional spacers are formed to isolate distinct regions of the LDMOS transistor from each other on a top surface of the silicon semiconductor structure. In one example of step 814 illustrated in FIGS. 21 and 22, spacers 934 are formed of a nitride material over top surface 914 of silicon semiconductor structure 904. FIG. 21 is a top plan view of the silicon semiconductor structure, and FIG. 22 is a cross-sectional view taken along lines 22A-22A of FIG. 21.

Figure 23:
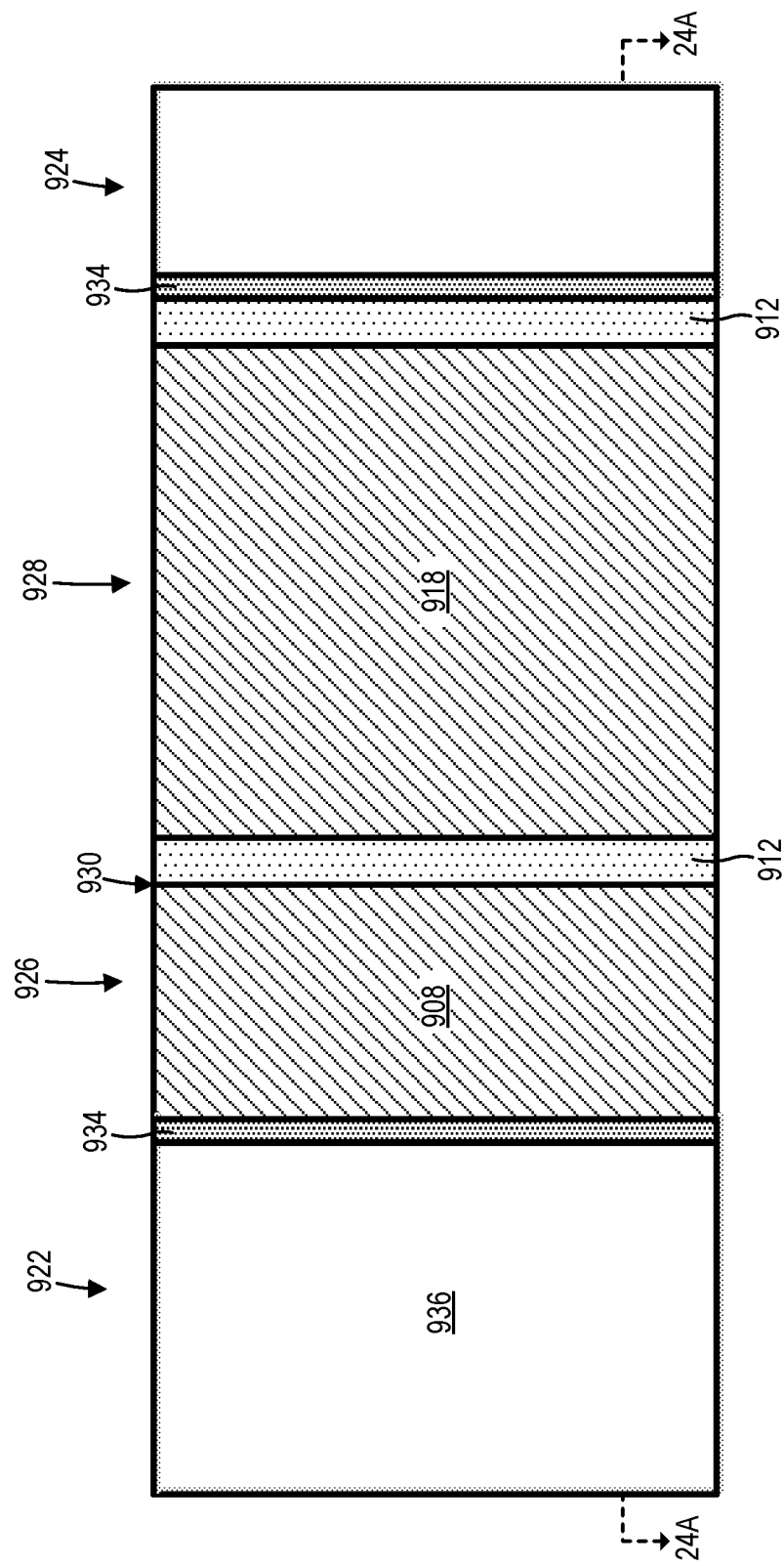
Figure 24:
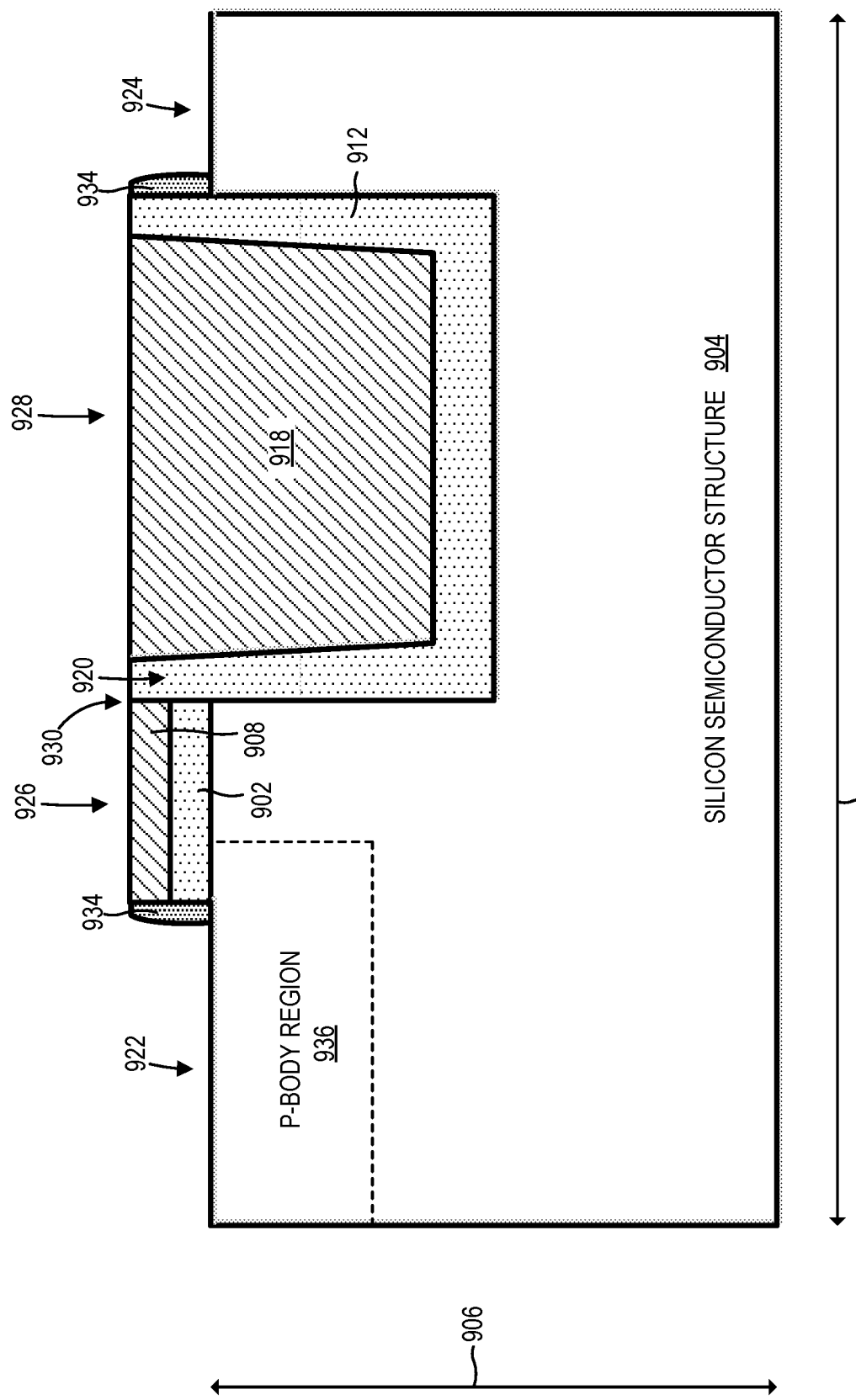
Figure 25:
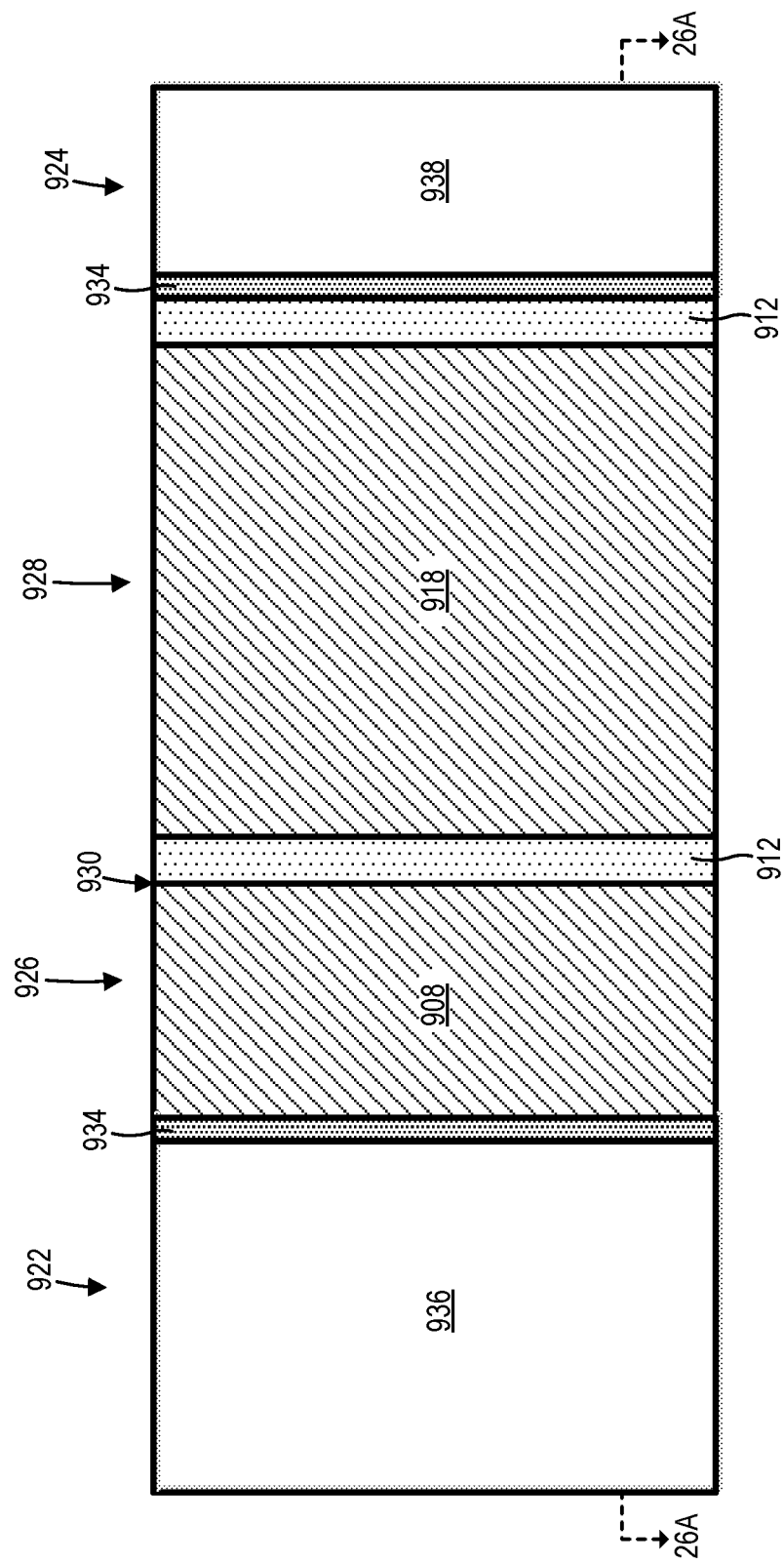
Figure 26:
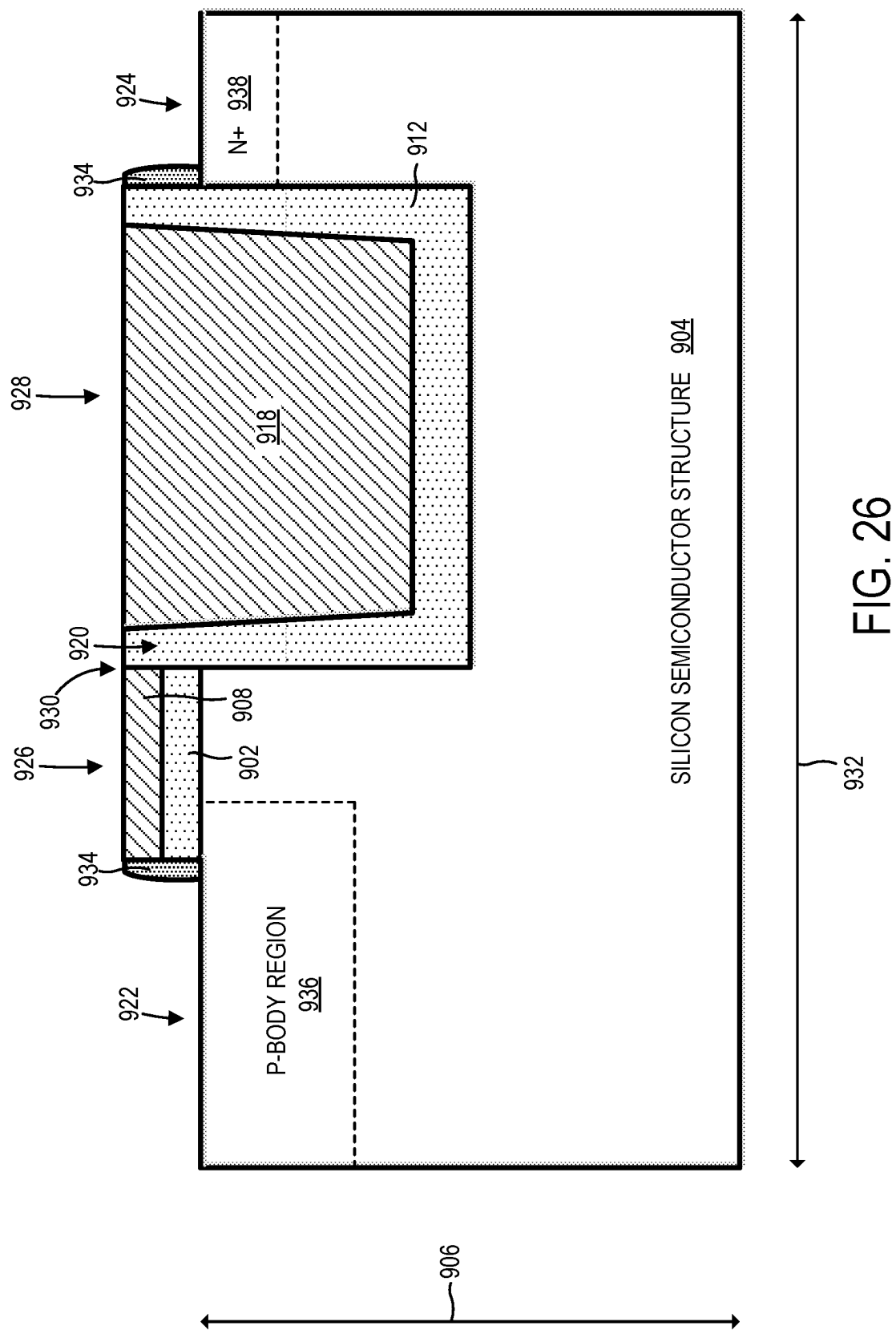
Figure 27:
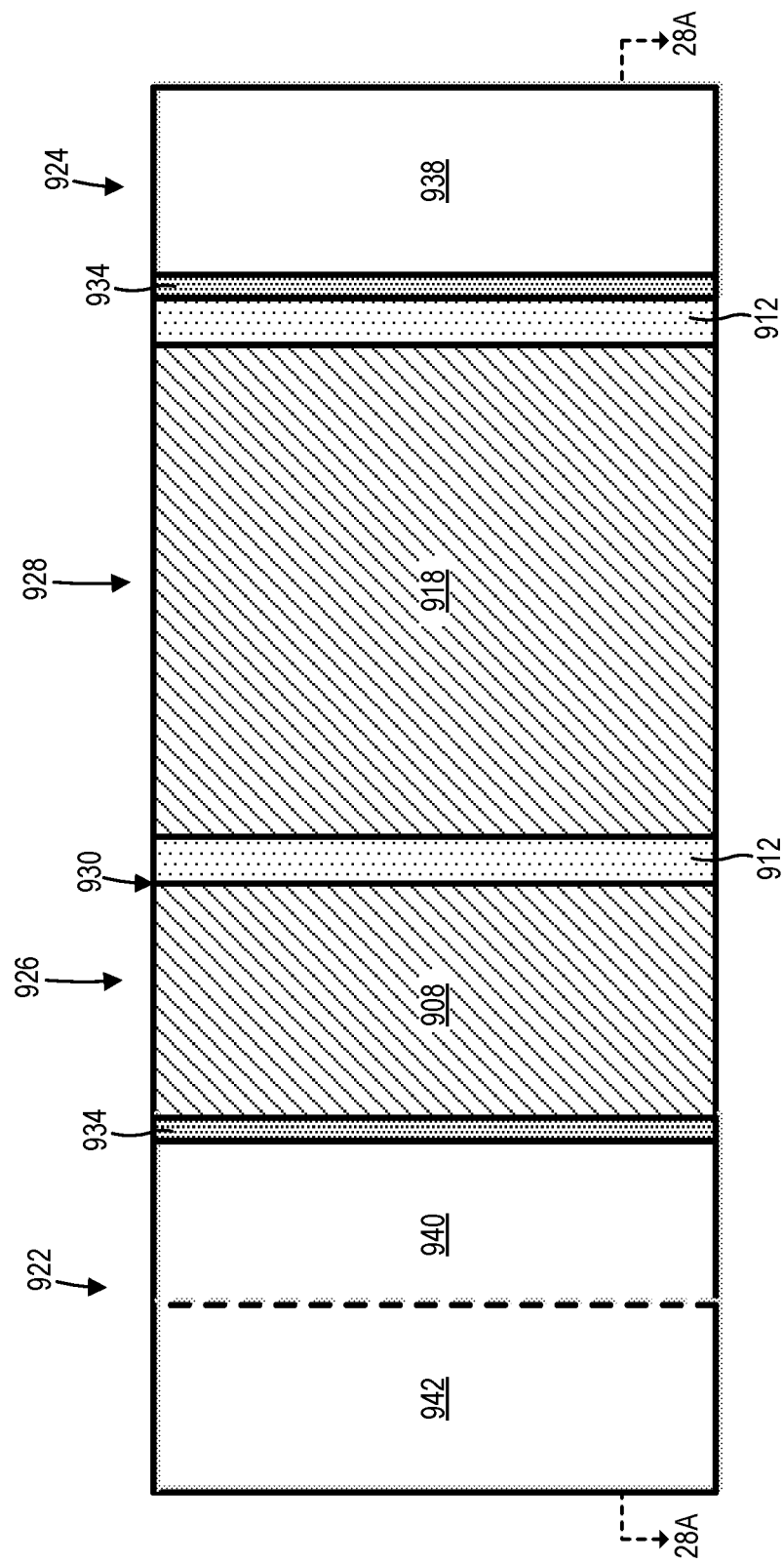
Figure 28:
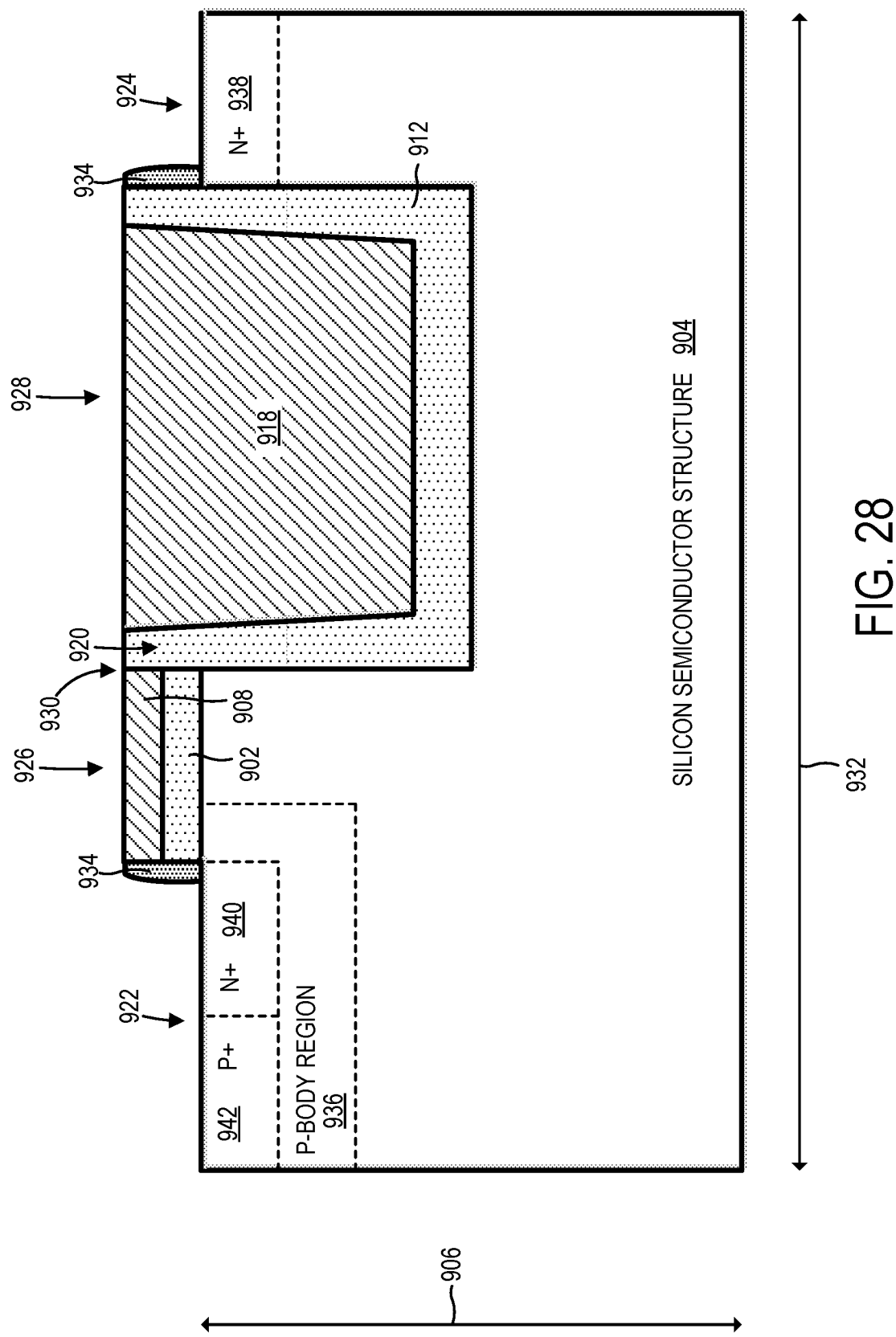

In step 816, p-type dopants are implanted into the silicon semiconductor structure in the source region of the LDMOS transistor using the lateral gate as a mask, to form a p-body region of the silicon semiconductor structure. In one example of step 816, p-type dopants are implanted into source region 922 using lateral gate 926 as a mask to form a p-body region 936 of silicon semiconductor structure 904, as illustrated in FIGS. 23 and 24. FIG. 23 is a top plan view of the silicon semiconductor structure, and FIG. 24 is a cross-sectional view taken along lines 24A-24A of FIG. 23. In step 818, n-type dopants are implanted into the silicon semiconductor structure in the drain region of the LDMOS transistor using the vertical gate as a mask, to form a drain n+ region of the silicon semiconductor structure. In one example of step 818, n-type dopants are implanted into drain region 924 using vertical gate 928 as a mask, to form a drain n+ region 938 of silicon semiconductor structure 904, as illustrated in FIGS. 25 and 26. FIG. 25 is a top plan view of the silicon semiconductor structure, and FIG. 26 is a cross-sectional view taken along lines 26A-26A of FIG. 25. In step 820, n-type dopants and p-type dopants are implanted into the p-body region of the silicon semiconductor structure to form a source n+ region and a source p+ region of the silicon semiconductor structure, respectively. In one example of step 820, n-type dopants and p-type dopants are implanted into p-body region 936 to form a source n+ region 940 and a source p+ region 942 of silicon semiconductor structure 904, respectively, as illustrated in FIGS. 27 and 28. FIG. 27 is a top plan view of the silicon semiconductor structure, and FIG. 28 is a cross-sectional view taken along lines 28A-28A of FIG. 27.

Figure 29:
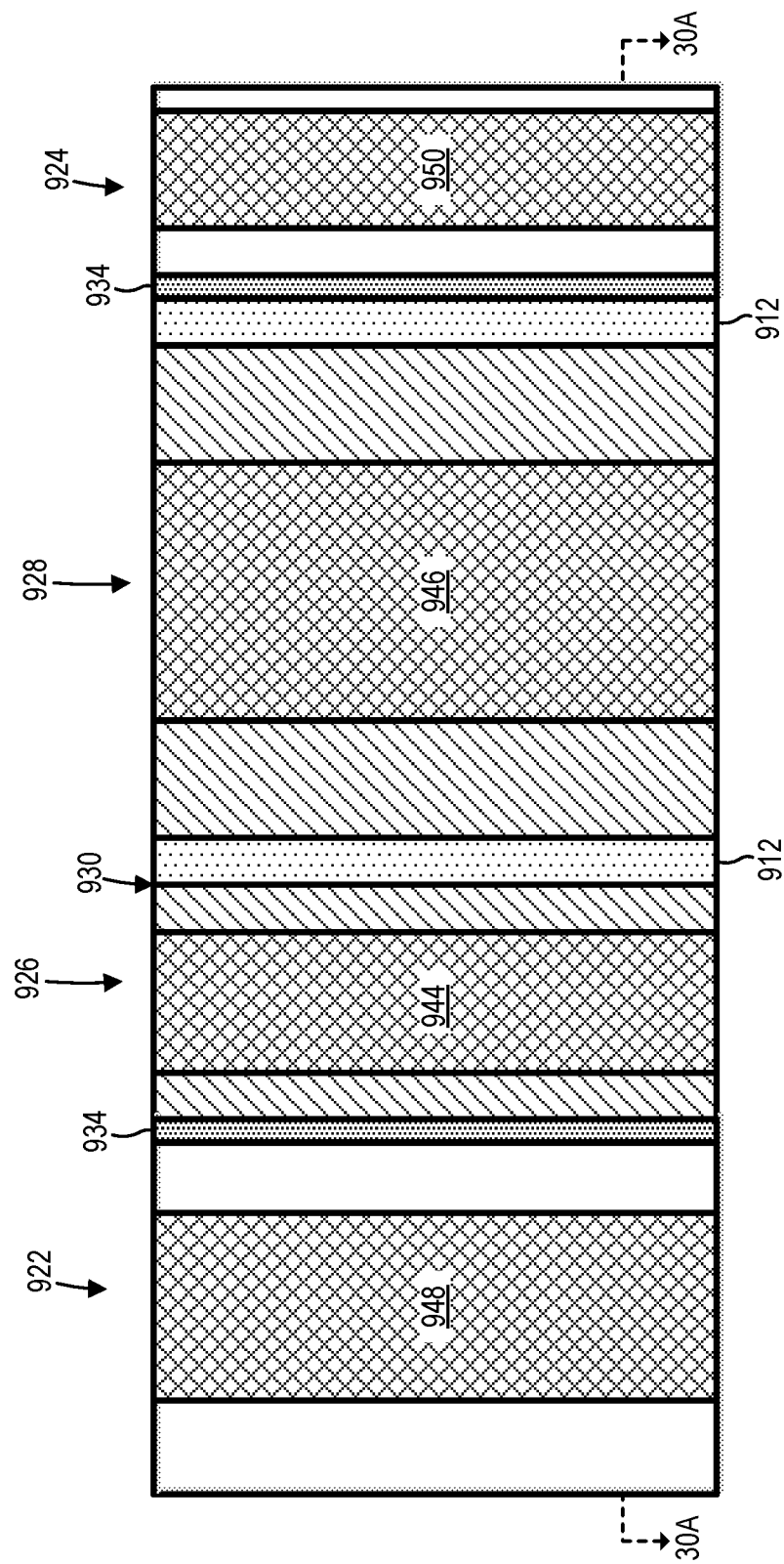
Figure 30:
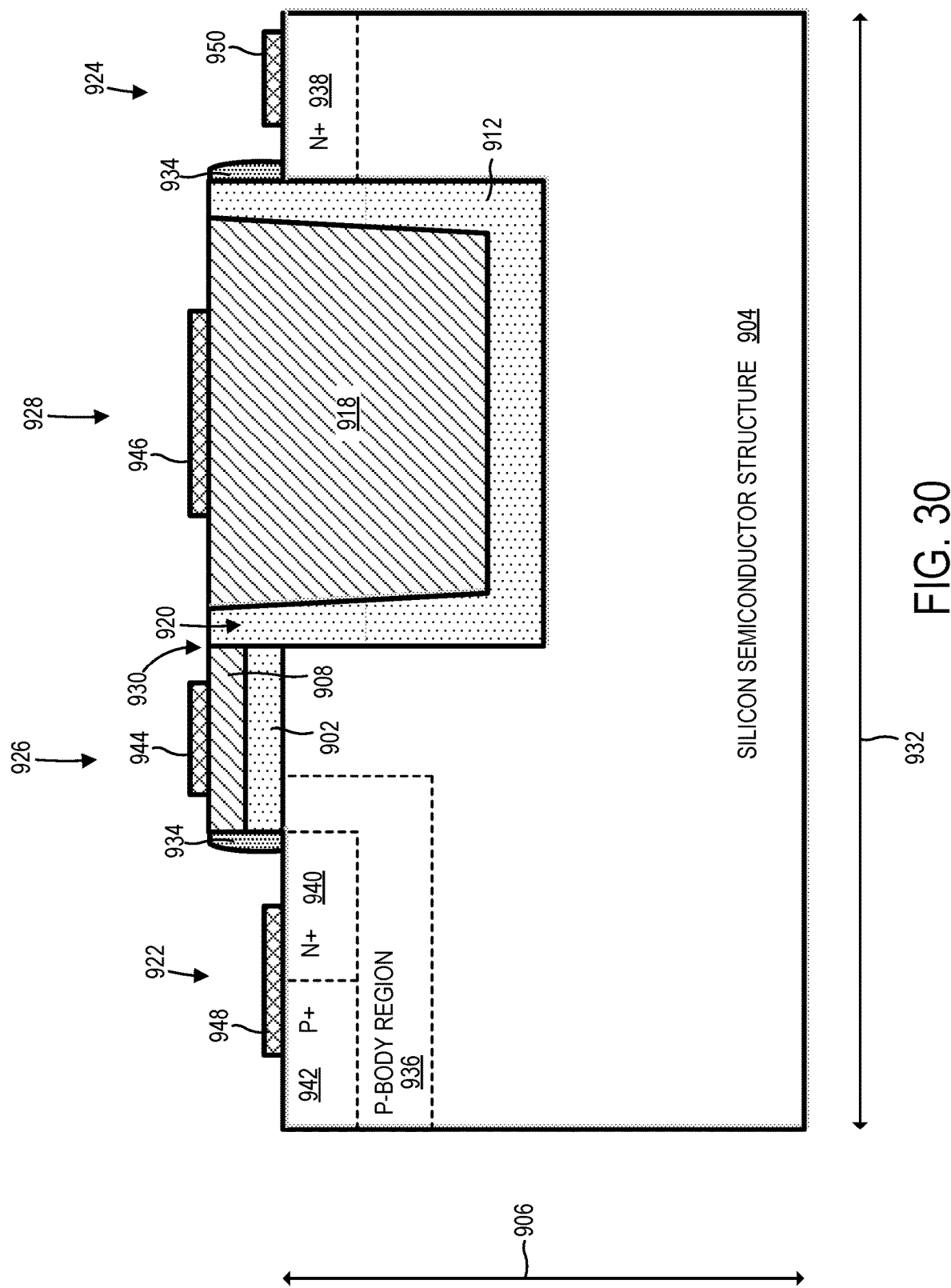

In step 822, electrodes are deposited on the silicon semiconductor structure to provide electrical interface to the LDMOS transistor. In one example of step 822, four electrodes are deposited on silicon semiconductor structure 904 to respectively form (a) a first gate electrode 944 contracting first conductive layer 908, (b) a second gate electrode 946 contacting second conductive layer 918, (c) a source electrode 948 contacting each of source n+ region 940 and source p+ region 942, and (d) a drain electrode 950 contacting drain n+ region 938, as illustrated in FIGS. 29 and 30. FIG. 29 is a top plan view of the silicon semiconductor structure, and FIG. 30 is a cross-sectional view taken along lines 30A-30A of FIG. 29.

Changes may be made in the above transistors, methods, and systems without departing from the scope hereof. For example, the n-channel LDMOS transistors discussed above could be modified to be p-channel LDMOS transistors. It should thus be noted that the matter contained in the above description and shown in the accompanying drawings should be interpreted as illustrative and not in a limiting sense. The following claims are intended to cover generic and specific features described herein, as well as all statements of the scope of the present devices, methods, and systems, which, as a matter of language, might be said to fall therebetween.

What is claimed is:

1. A dual-gate, self-aligned lateral double-diffused metal-oxide-semiconductor (LDMOS) transistor, comprising:
    a silicon semiconductor structure;
    a lateral gate including a first dielectric layer and a first conductive layer stacked on the silicon semiconductor structure in a thickness direction; and
    a vertical gate including a second dielectric layer and a second conductive layer disposed in a trench of the silicon semiconductor structure, the second dielectric layer defining an edge of the lateral gate in a lateral direction, the lateral direction being orthogonal to the thickness direction.

2. The LDMOS transistor of claim 1, the second dielectric layer adjoining the first conductive layer in the lateral direction.

3. The LDMOS transistor of claim 1, the silicon semiconductor structure including:
    a base layer;
    an n-type layer disposed over the base layer in the thickness direction;
    a p-body region disposed in the n-type layer;
    a source p+ region and a source n+ region each disposed in the p-body region; and
    a drain n+ region disposed in the n-type layer.

4. The LDMOS transistor of claim 3, wherein the base layer is selected from the group consisting of an n-type high-voltage well in a silicon substrate, a p-type silicon substrate, and an n-type epitaxial layer.

5. The LDMOS transistor of claim 3, wherein:
    the lateral gate is disposed between the source n+ region and the vertical gate in the lateral direction;
    the vertical gate is disposed between the lateral gate and drain n+ region in the lateral direction;
    the trench extends into the silicon semiconductor structure in the thickness direction; and
    the lateral gate extends over a portion of the p-body in the thickness direction.

6. The LDMOS transistor of claim 3, further comprising:
    a first gate electrode contacting the first conductive layer;
    a second gate electrode contacting the second conductive layer;
    a source electrode contacting each of the source p+ region and the source n+ region; and
    a drain electrode contacting the drain n+ region.

7. The LDMOS transistor of claim 3, wherein:
    the source p+ region has a greater p-type dopant concentration than the p-body region; and
    each of the source and drain n+ regions has a greater n-type dopant concentration than the n-type layer.

8. The LDMOS transistor of claim 1, wherein the second conductive layer is embedded in second first dielectric layer in the trench.

9. The LDMOS transistor of claim 1, wherein each of the first and second dielectric layers is formed of silicon dioxide.

10. The LDMOS transistor of claim 1, wherein each of the first and second dielectric layers is formed of one or more high-K dielectric materials.

11. The LDMOS transistor of claim 10, the one or more high-K dielectric materials including at least one of $HfO_2$, $TiO_2$, $ZrO_2$, and $HfAlO_x$.

12. The LDMOS transistor of claim 1, each of the first and second conductive layers being formed of polysilicon.

13. A method for forming a dual-gate, self-aligned lateral double-diffused metal-oxide-semiconductor (LDMOS) transistor, the method comprising the steps of:
    forming a vertical gate of the LDMOS transistor in a trench of a silicon semiconductor structure; and
    defining a lateral edge of a lateral gate of the LDMOS transistor using the vertical gate.

14. The method of claim 13, further comprising the following steps, executed before the step of forming the vertical gate:
    depositing a first dielectric layer on the silicon semiconductor structure in a thickness direction; and
    depositing a first conductive layer on the first dielectric layer in the thickness direction,
    the first dielectric layer and the first conductive layer collectively forming the lateral gate.

15. The method of claim 14, wherein the step of forming the vertical gate of the LDMOS transistor includes:
    forming the trench in the silicon semiconductor structure;
    depositing a second dielectric layer in the trench; and
    depositing a second conductive layer in trench,
    the second dielectric layer and the second conductive layer collectively forming the vertical gate.

16. The method of claim 15, the step of defining the lateral edge of the lateral gate comprising etching the second dielectric layer to form a spacer separating the first conductive layer from the second conductive layer.

17. The method of claim 15, further comprising etching the first dielectric layer and the first conductive layer to define a source region of the LDMOS transistor and a drain region of the LDMOS transistor.

18. The method of claim 17, further comprising:
    implanting p-type dopants into the silicon semiconductor structure in the source region of the LDMOS transistor using the lateral gate as a mask, to form a p-body region of the silicon semiconductor structure; and implanting n-type dopants into the silicon semiconductor structure in the drain region of the LDMOS transistor using the vertical gate as a mask, to form a drain n+ region of the silicon semiconductor structure.

19. The method of claim 18, further comprising:

implanting n-type dopants into the p-body region of the silicon semiconductor structure to form a source n+ region; and implanting p-type dopants into the p-body region of the silicon semiconductor structure to form a source p+ region.

20. The method of claim 15, wherein:

each of the first and second conductive layers includes polysilicon; and each of the first and second dielectric layers is formed of a material selected from the group consisting of silicon dioxide and a high-K dielectric material.

\* \* \* \* \*